(12) United States Patent
Passlack et al.

(10) Patent No.: US 11,088,246 B2
(45) Date of Patent: Aug. 10, 2021

(54) METHOD OF MANUFACTURING A FIELD EFFECT TRANSISTOR USING CARBON NANOTUBES AND A FIELD EFFECT TRANSISTOR

(71) Applicant: TAIWAN SEMICONDUCTOR MANUFACTURING CO., LTD., Hsinchu (TW)

(72) Inventors: Matthias Passlack, Huldenberg (BE); Marcus Johannes Henricus Van Dal, Linden (BE); Timothy Vasen, Tervuren (BE); Georgios Vellianitis, Heverlee (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/516,181

(22) Filed: Jul. 18, 2019

(65) Prior Publication Data

US 2021/0020745 A1  Jan. 21, 2021

(51) Int. Cl.
*H01L 21/02* (2006.01)
*H01L 21/8234* (2006.01)
(Continued)

(52) U.S. Cl.
CPC ...... *H01L 29/0673* (2013.01); *H01L 21/0217* (2013.01); *H01L 21/02164* (2013.01);
(Continued)

(58) Field of Classification Search
CPC ............ H01L 29/0665; H01L 29/0669; H01L 29/0673; H01L 29/0882–0886;
(Continued)

(56) References Cited

U.S. PATENT DOCUMENTS 9,472,773 B1* 10/2016 Rosenblatt ........ H01L 29/42392
9,595,583 B2*  3/2017 Kim ..................... H01L 27/1211
(Continued)

OTHER PUBLICATIONS

Franklin, Aaron D., et al. "Carbon Nanotube Complementary Wrap-Gate Transistors." American Chemical Society, Nano Letters, vol. 13, pp. 2490-2495 (2013).
(Continued)

*Primary Examiner* — Natalia A Gondarenko
(74) *Attorney, Agent, or Firm* — McDermott Will & Emery LLP

(57) ABSTRACT

In a method of forming a gate-all-around field effect transistor (GAA FET), a fin structure is formed. The fin structure includes a plurality of stacked structures each comprising a dielectric layer, a CNT over the dielectric layer, a support layer over the CNT. A sacrificial gate structure is formed over the fin structure, an isolation insulating layer is formed, a source/drain opening is formed by patterning the isolation insulating layer, the support layer is removed from each of the plurality of stacked structures in the source/drain opening, and a source/drain contact layer is formed in the source/drain opening. The source/drain contact is formed such that the source/drain contact is in direct contact with only a part of the CNT and a part of the dielectric layer is disposed between the source/drain contact and the CNT.

20 Claims, 39 Drawing Sheets

(51) Int. Cl.
    *H01L 29/06* (2006.01)
    *H01L 29/40* (2006.01)
    *H01L 29/66* (2006.01)
    *H01L 29/08* (2006.01)
    *H01L 29/78* (2006.01)

(52) U.S. Cl.
    CPC .. *H01L 21/02178* (2013.01); *H01L 21/02181* (2013.01); *H01L 29/0847* (2013.01); *H01L 29/66545* (2013.01); *H01L 29/66795* (2013.01); *H01L 29/785* (2013.01)

(58) Field of Classification Search
    CPC ..... H01L 29/0865–0869; H01L 29/413; H01L 29/41758; H01L 29/42392; H01L 29/66795; H01L 29/66871; H01L 29/66583; H01L 29/66606; H01L 29/66545; H01L 29/0847; H01L 29/785; H01L 21/02178; H01L 21/02181; H01L 21/02164; H01L 21/0217; H01L 2224/05893; H01L 2224/13193; H01L 2224/29193; H01L 2224/29293; H01L 2224/29793; H01L 2224/29893; H01L 2224/05193; H01L 2224/05293; H01L 2224/05393; H01L 2224/05693; H01L 2924/13061; H01L 2924/15793; H01L 2924/16178; H01L 2924/16593; H01L 2924/16793; H01L 2924/17793; H01L 21/02236; H01L 21/31116; H01L 21/31111; H01L 21/02255; H01L 29/6653; H01L 29/66818; H01L 29/6681; H01L 29/42384; H01L 29/7843; H01L 29/7849; H01L 29/7853; H01L 2029/42388; H01L 21/02378; H01L 21/02381; H01L 21/02428; H01L 21/02444; H01L 21/0245; H01L 21/02496; H01L 21/02505; H01L 21/02507; H01L 21/02603; H01L 21/0257; H01L 21/02532; H01L 21/3065; H01L 21/3215; H01L 21/32155; H01L 21/47573; H01L 21/23857; H01L 21/82385; H01L 21/823814; H01L 21/67069; H01L 21/76837; H01L 21/76877; H01L 21/823821; H01L 21/823842; H01L 21/02518; H01L 21/02527; H01L 21/02529; H01L 21/20; H01L 21/2033; H01L 21/2053; H01L 21/2251; H01L 21/2253; H01L 21/823807
    USPC ..................... 257/24, 288, 325; 438/584, 240
    See application file for complete search history.

(56) References Cited

U.S. PATENT DOCUMENTS

| | | | | |
|---|---|---|---|---|
| 10,263,100 | B1* | 4/2019 | Bi | ............ B82Y 10/00 |
| 10,269,929 | B2* | 4/2019 | Wostyn | ............. H01L 29/41725 |
| 2008/0087945 | A1* | 4/2008 | Forbes | .............. H01L 21/28079 |
| | | | | 257/325 |
| 2010/0072460 | A1* | 3/2010 | Bjoerk | .............. H01L 29/42392 |
| | | | | 257/24 |
| 2013/0341704 | A1 | 12/2013 | Rachmady et al. | |
| 2017/0170267 | A1 | 6/2017 | Rosenblatt et al. | |
| 2018/0315838 | A1* | 11/2018 | Morrow | .............. H01L 27/0688 |
| 2020/0091288 | A1* | 3/2020 | Lee | .................. H01L 29/66545 |

OTHER PUBLICATIONS

Ha, Tae-Jun et al., "Hightly Uniform and Stable n-Type Carbon Nanotube Transistors by Using Positively Charged Silicon Nitride Thin Films," American Chemical Society, Nano Letters, vol. 15, pp. 392-397 (2015).

Kamata, Hironobu et al., "Design of Al2O3/SiO2 laminated stacks with multiple interface dipole layers to achieve large flatband voltage shifts of MOS capacitors," Applied Physics Letters 110, 102106 (2017).

Kita, Koji et al., "Origin of electric dipoles formed at high-k/SiO2 interface," Applied Physics Letters 94, 132902 (2009).

\* cited by examiner

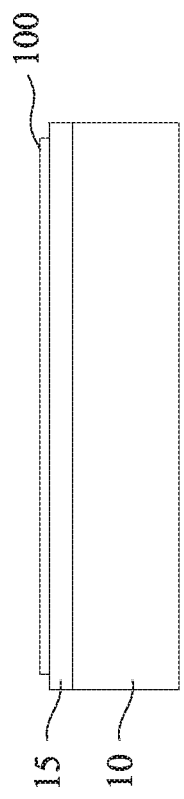
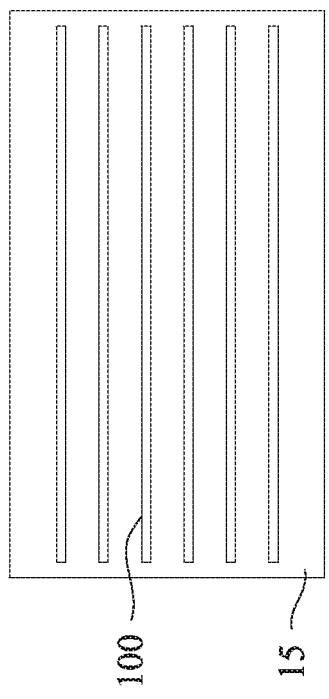
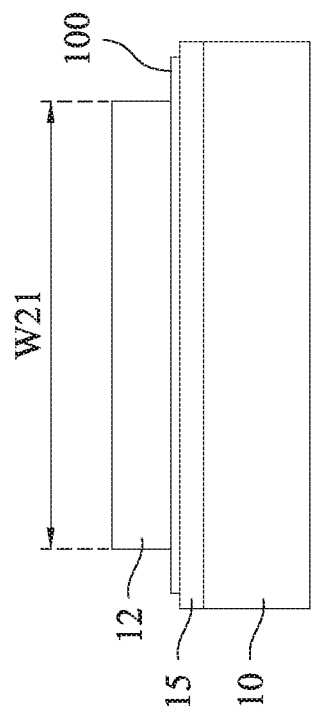
FIG. 7A
FIG. 7B
FIG. 7C

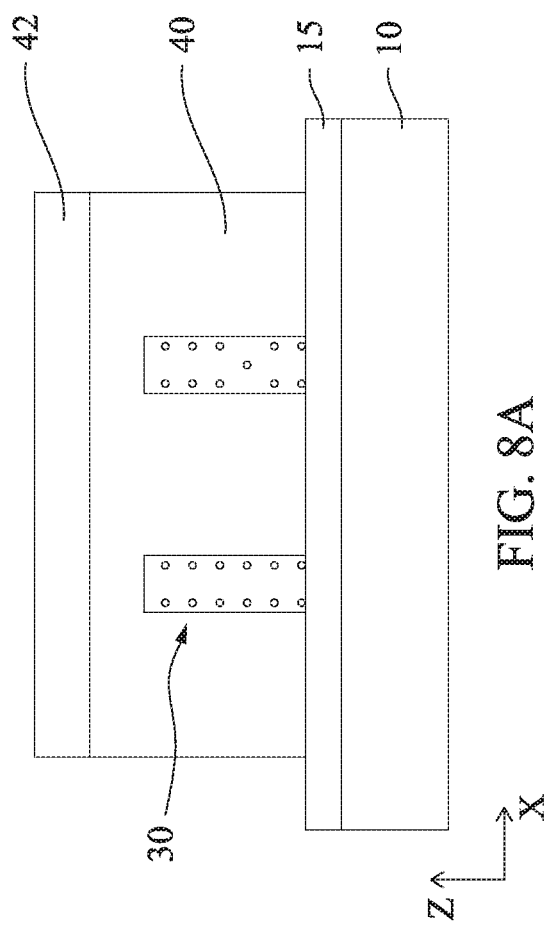
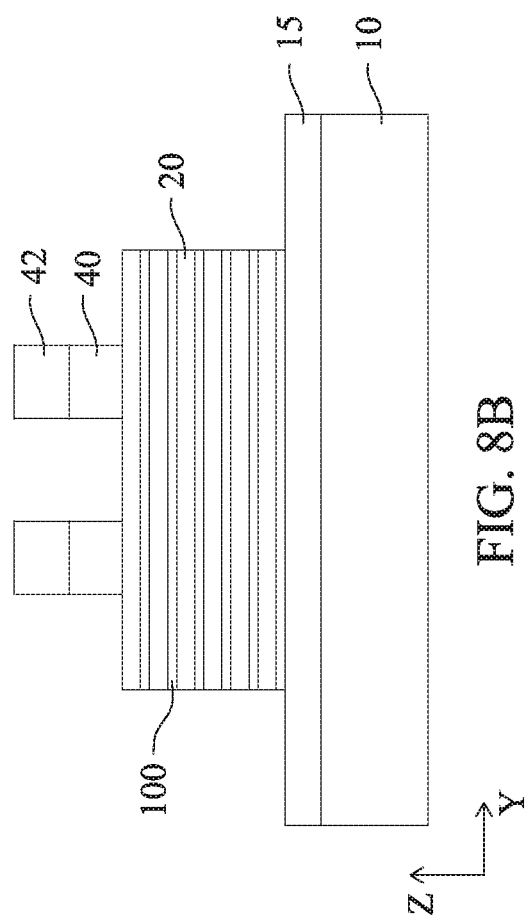
FIG. 8A
FIG. 8B

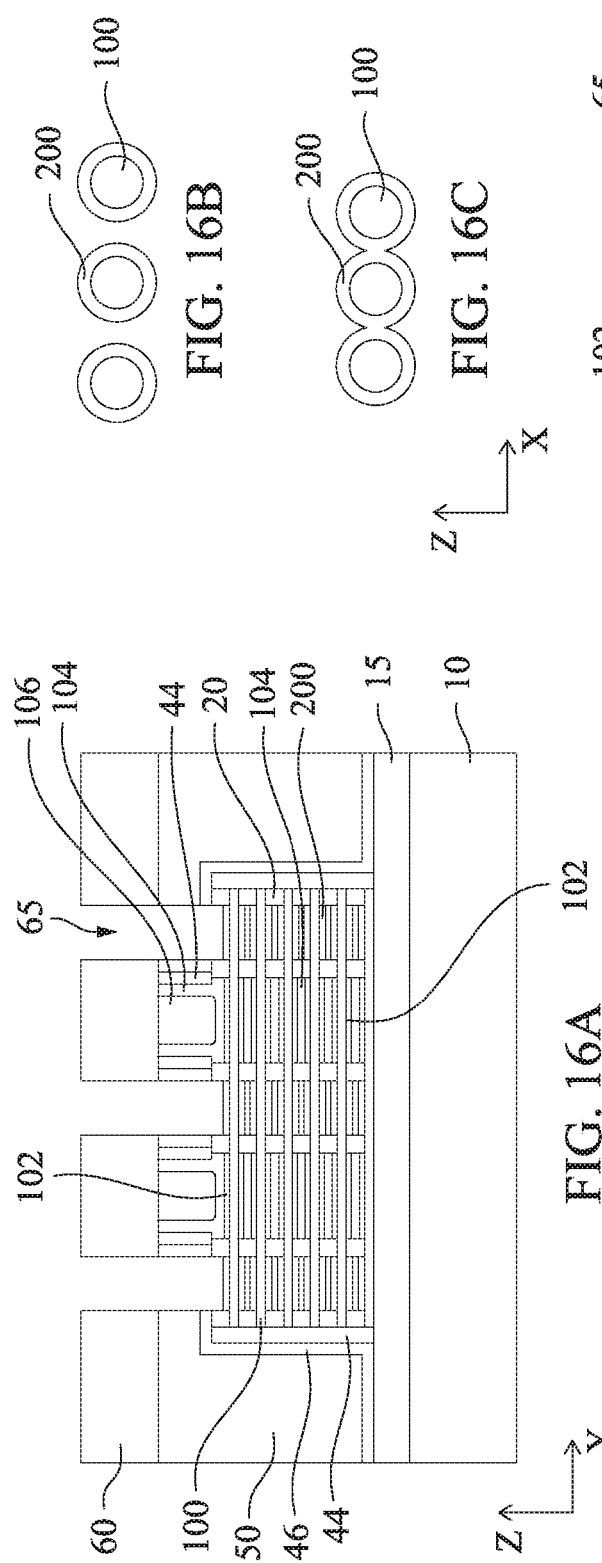
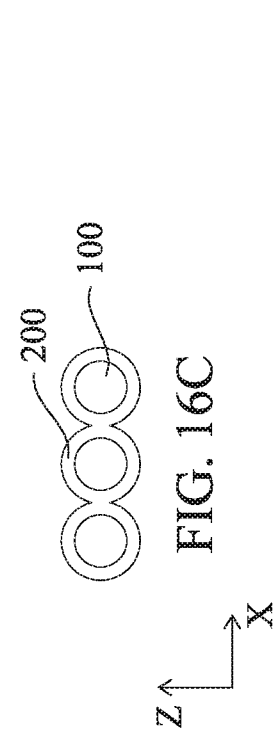
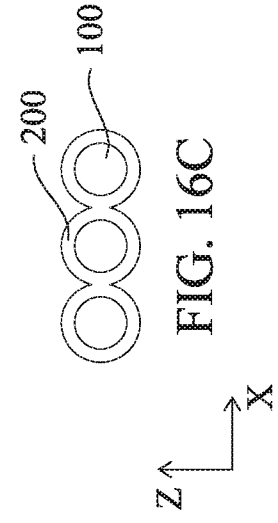
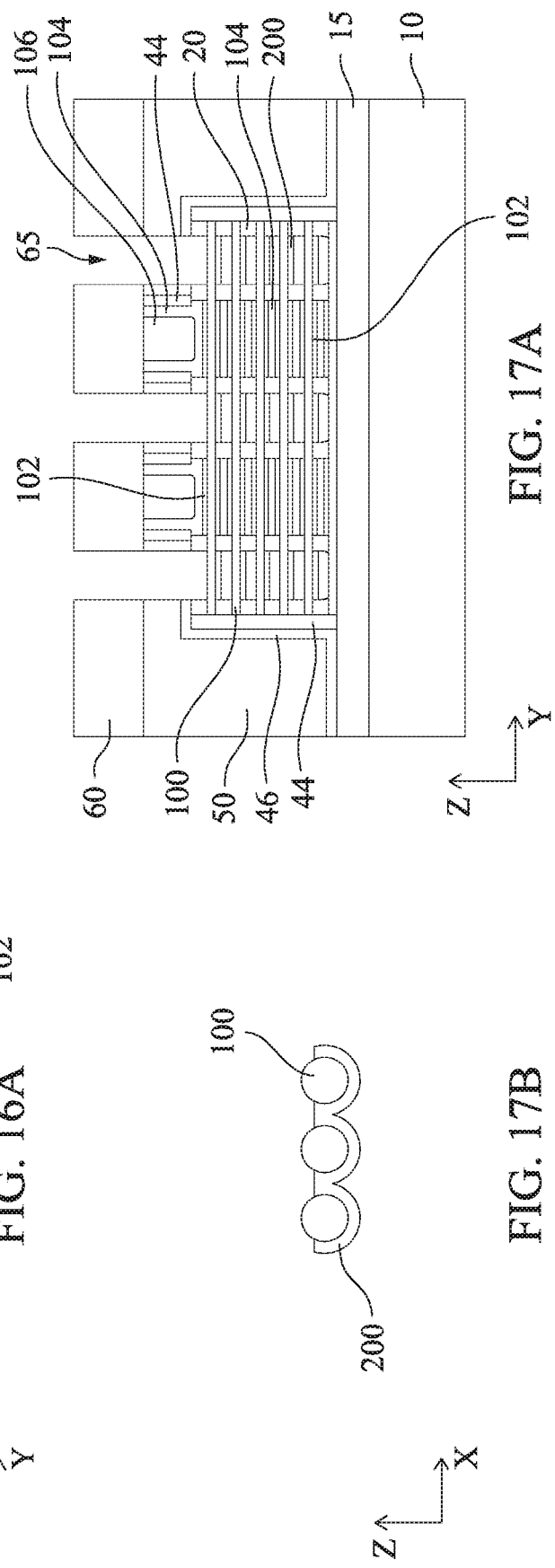
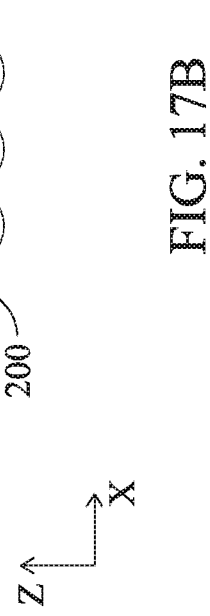

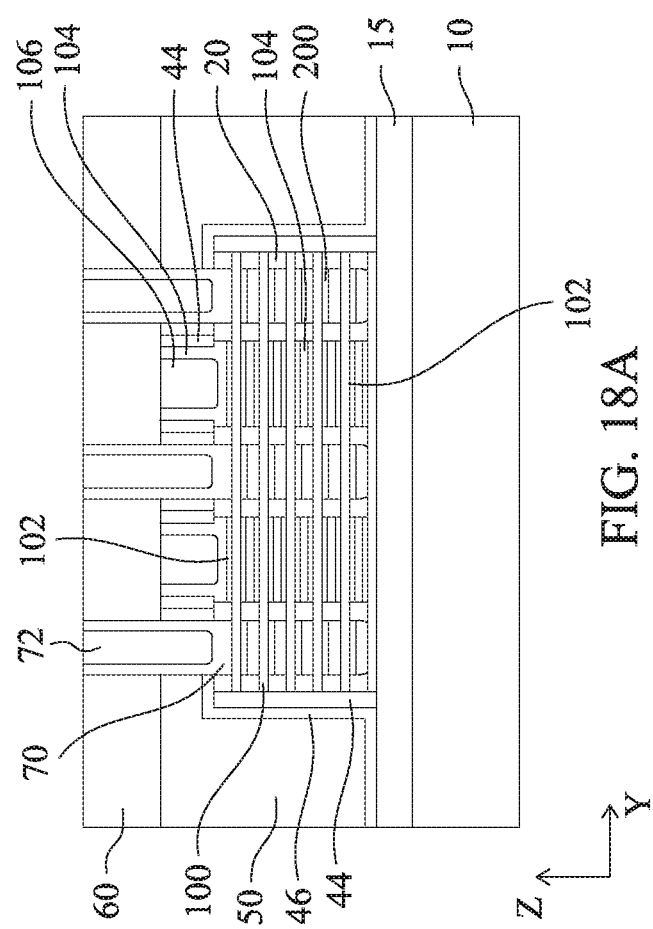
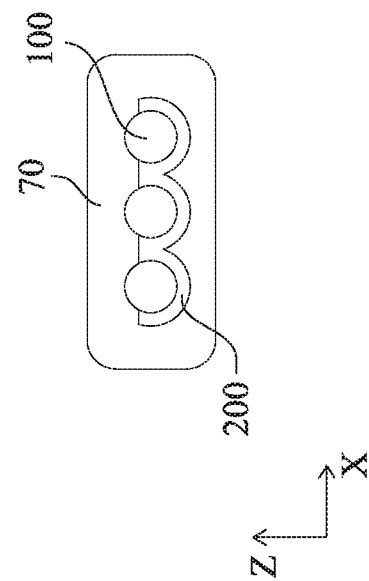
FIG. 18A
FIG. 18B

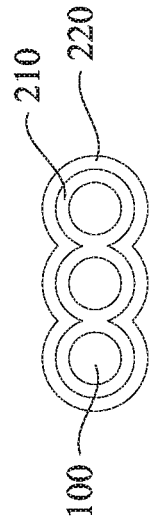
FIG. 19A
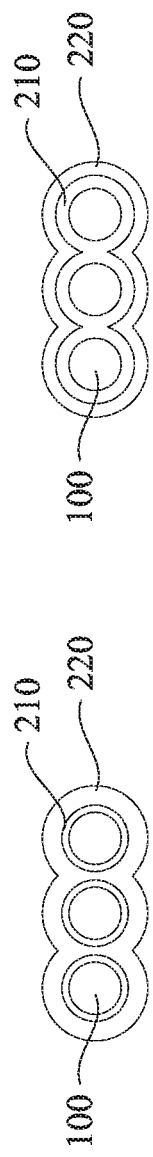
FIG. 19B
FIG. 19C
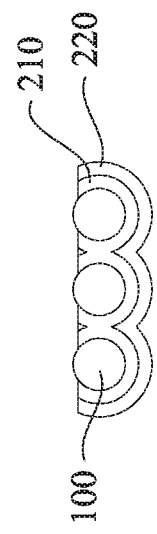
FIG. 19D
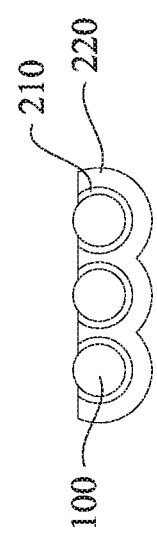
FIG. 19E
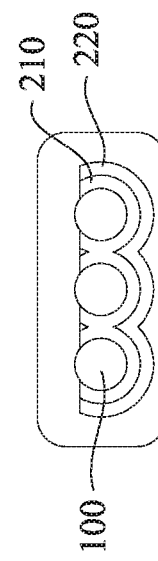
FIG. 19F
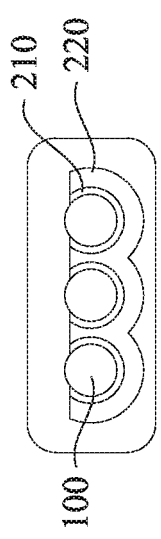

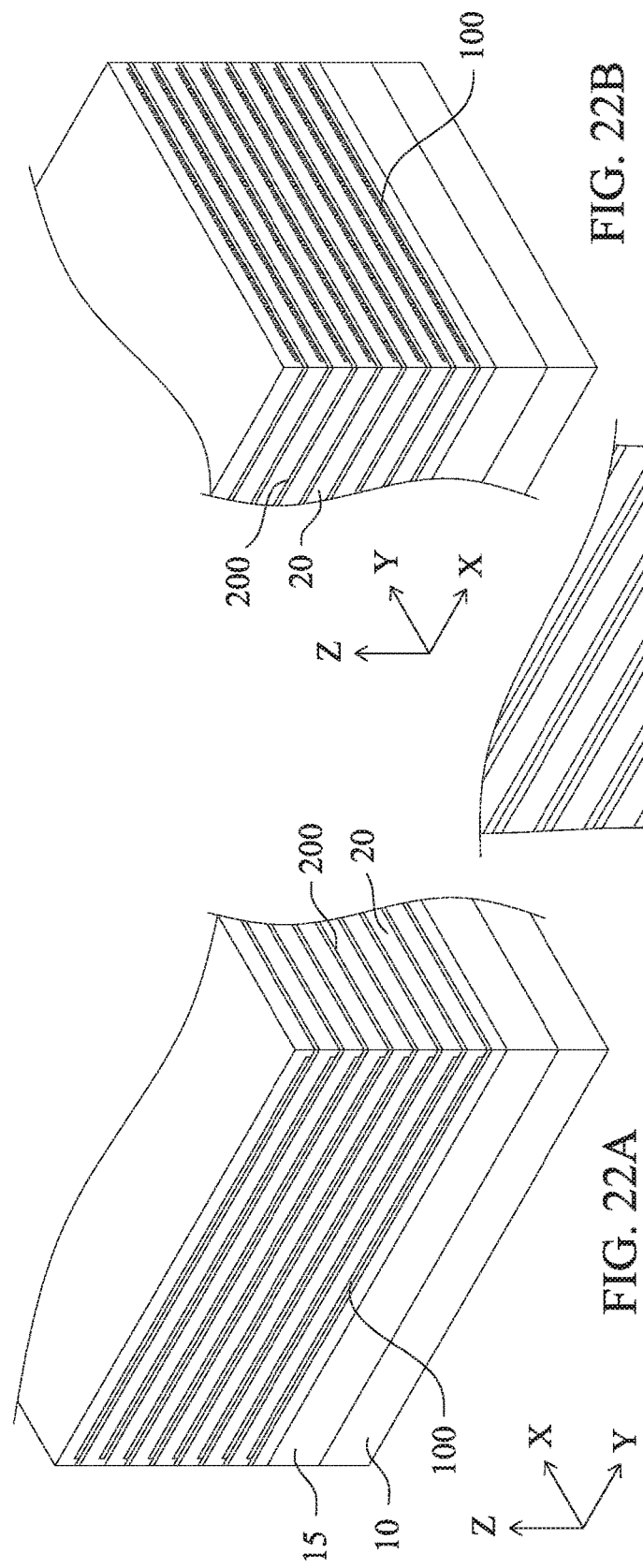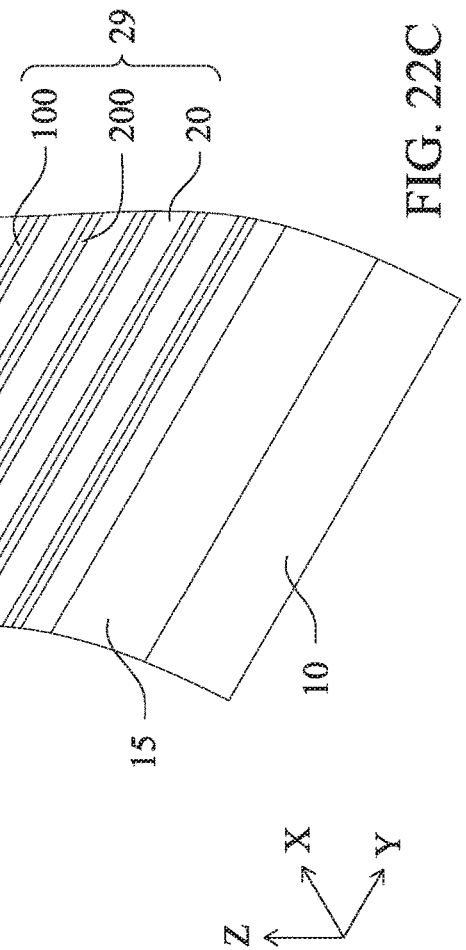

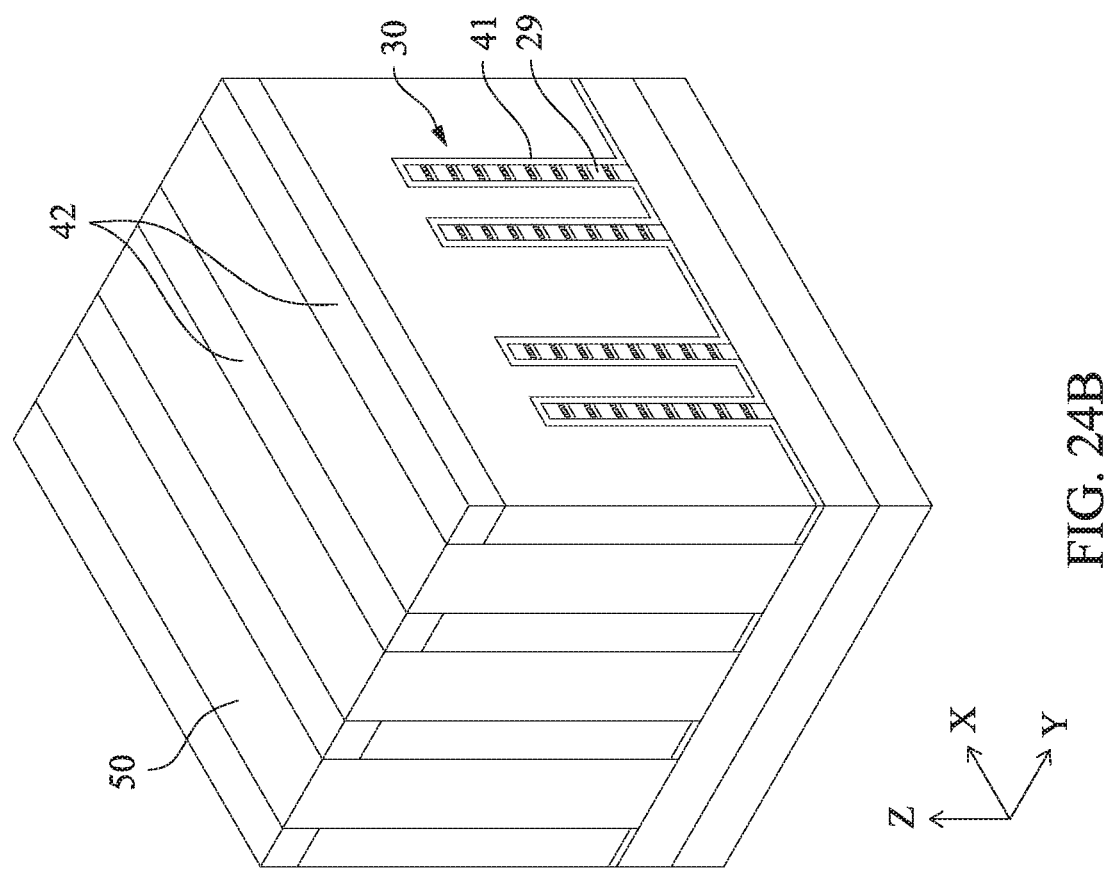
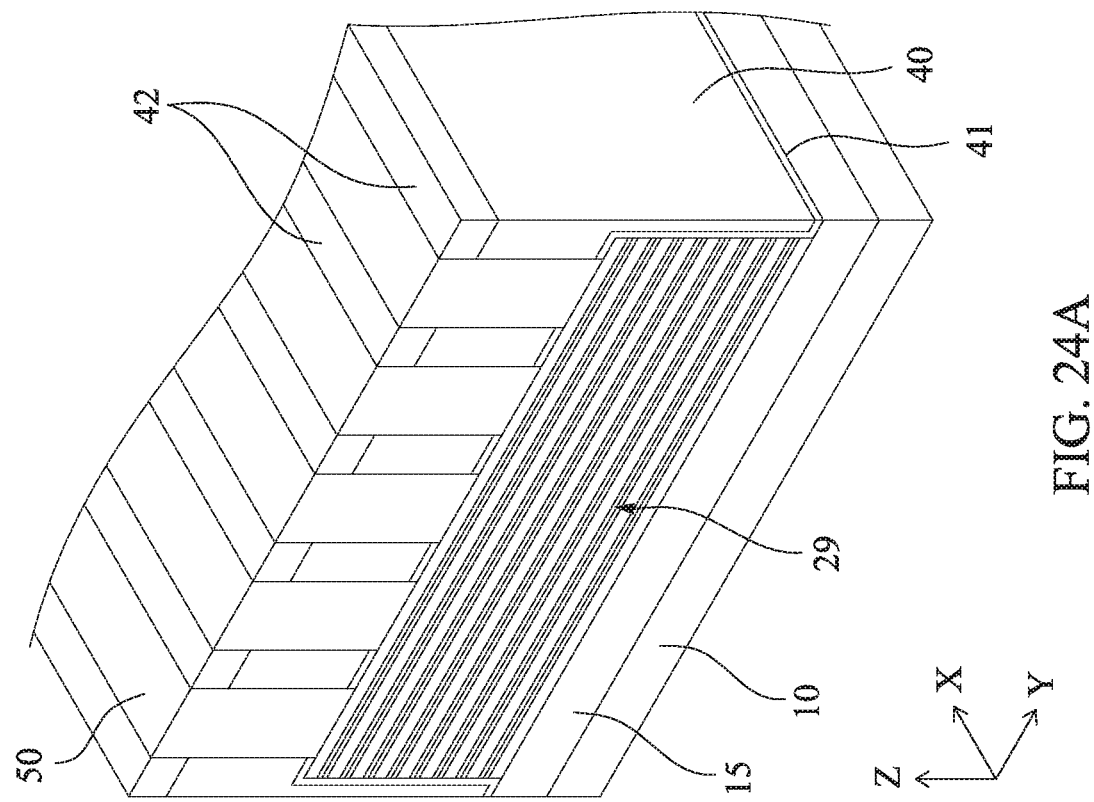
FIG. 24B
FIG. 24A

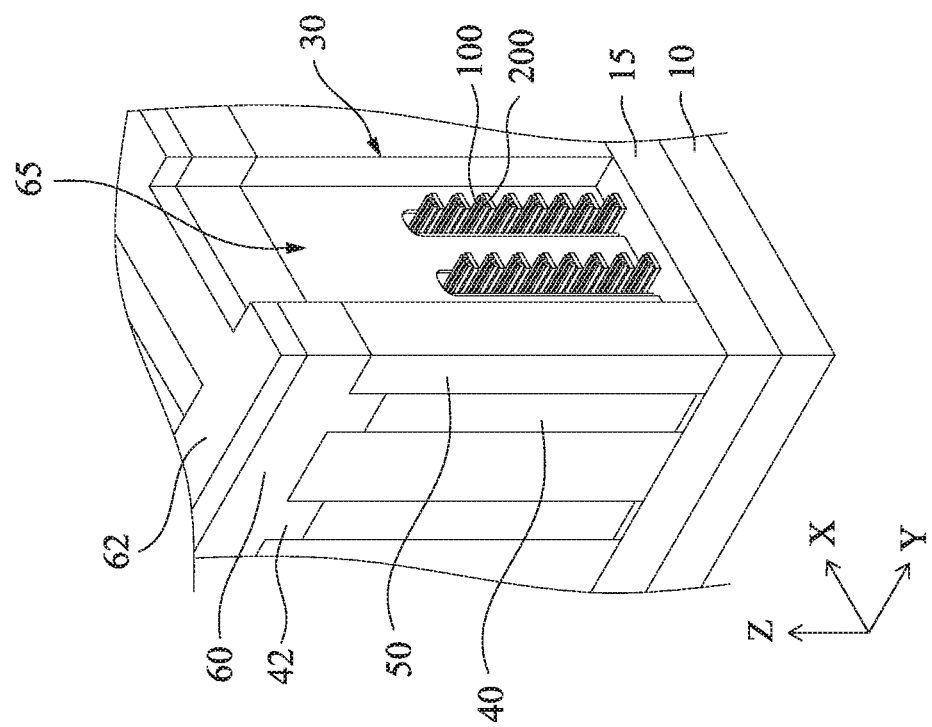
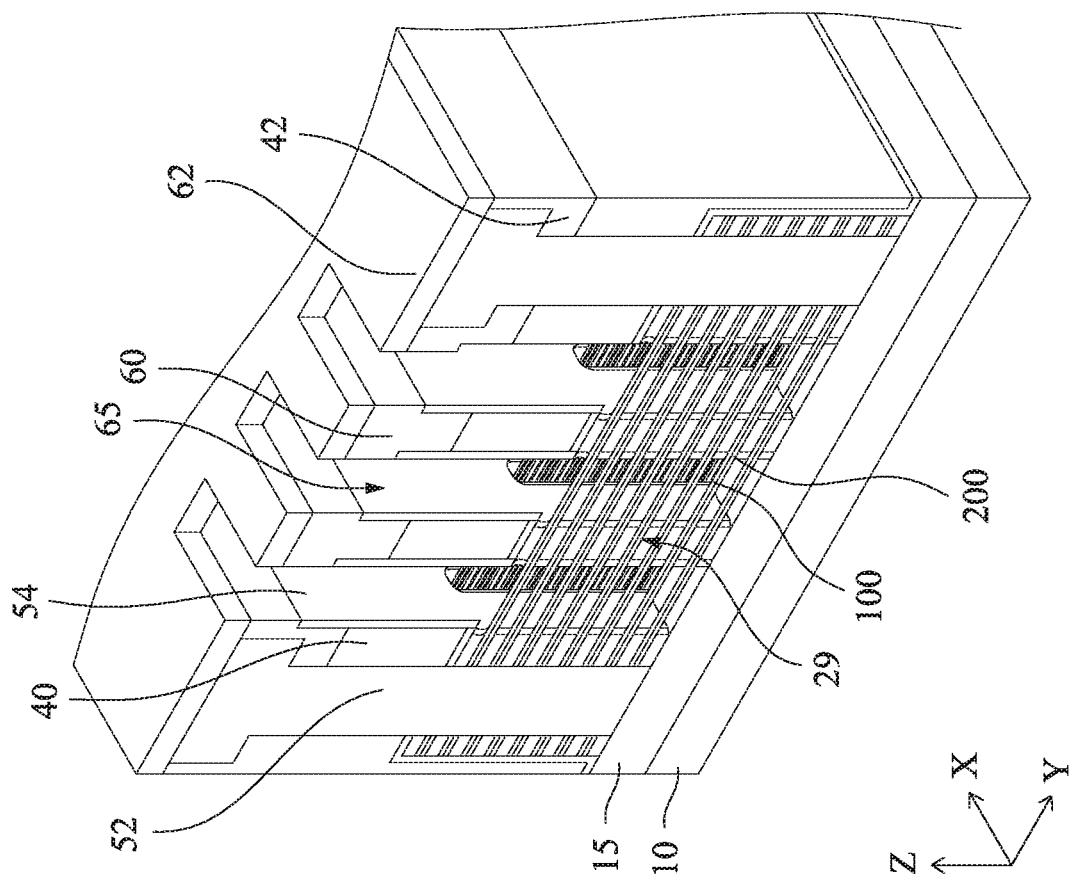
FIG. 26A
FIG. 26B

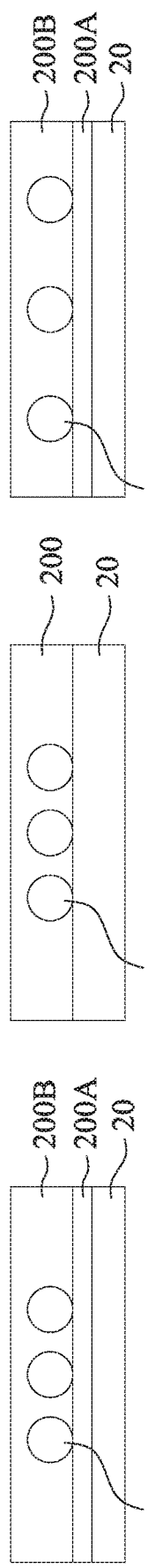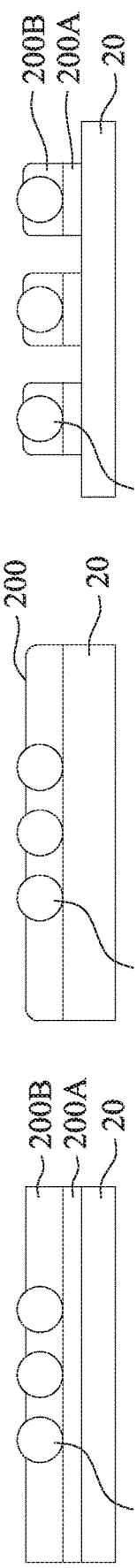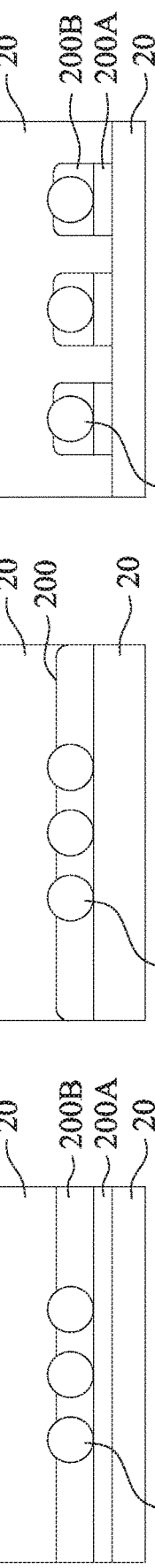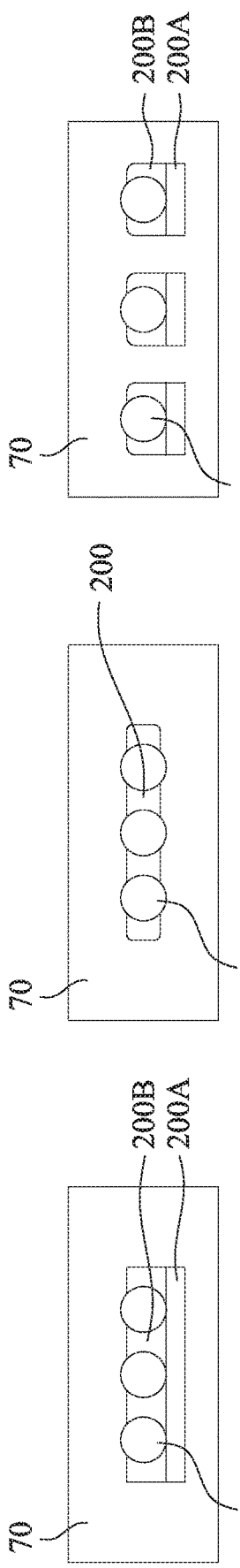

METHOD OF MANUFACTURING A FIELD EFFECT TRANSISTOR USING CARBON NANOTUBES AND A FIELD EFFECT TRANSISTOR

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 7C, 7D and 7E show various stages of a sequential fabrication process of a GAA FET using a CNT in accordance with an embodiment of the present disclosure.

FIGS. 8A and 8B illustrate one of the various stages of a sequential fabrication process of a GAA FET using a CNT in accordance with an embodiment of the present disclosure.

FIGS. 16A, 16B and 16C illustrate one of the various stages of a sequential fabrication process of a GAA FET using a CNT in accordance with an embodiment of the present disclosure.

FIGS. 17A and 17B illustrate one of the various stages of a sequential fabrication process of a GAA FET using a CNT in accordance with an embodiment of the present disclosure.

FIGS. 18A and 18B illustrate one of the various stages of a sequential fabrication process of a GAA FET using a CNT in accordance with an embodiment of the present disclosure.

FIGS. 19A, 19B and 19C illustrate various stages of a sequential fabrication process of a GAA FET using a CNT in accordance with an embodiment of the present disclosure.

FIGS. 19D, 19E and 19F illustrate various stages of a sequential fabrication process of a GAA FET using a CNT in accordance with an embodiment of the present disclosure.

FIGS. 22A, 22B and 22C illustrate one of the various stages of a sequential fabrication process of a GAA FET using a CNT in accordance with an embodiment of the present disclosure.

FIGS. 24A and 24B illustrate one of the various stages of a sequential fabrication process of a GAA FET using a CNT in accordance with an embodiment of the present disclosure.

FIGS. 26A and 26B illustrate one of the various stages of a sequential fabrication process of a GAA FET using a CNT in accordance with an embodiment of the present disclosure.

FIGS. 32A, 32B, 32C and 32D illustrate various stages of a sequential fabrication process of a GAA FET using a CNT in accordance with an embodiment of the present disclosure.

FIGS. 33A, 33B, 33C and 33D illustrate various stages of a sequential fabrication process of a GAA FET using a CNT in accordance with an embodiment of the present disclosure.

FIGS. 34A, 34B, 34C and 34D illustrate various stages of a sequential fabrication process of a GAA FET using a CNT in accordance with an embodiment of the present disclosure.

DETAILED DESCRIPTION

Figure 1A:
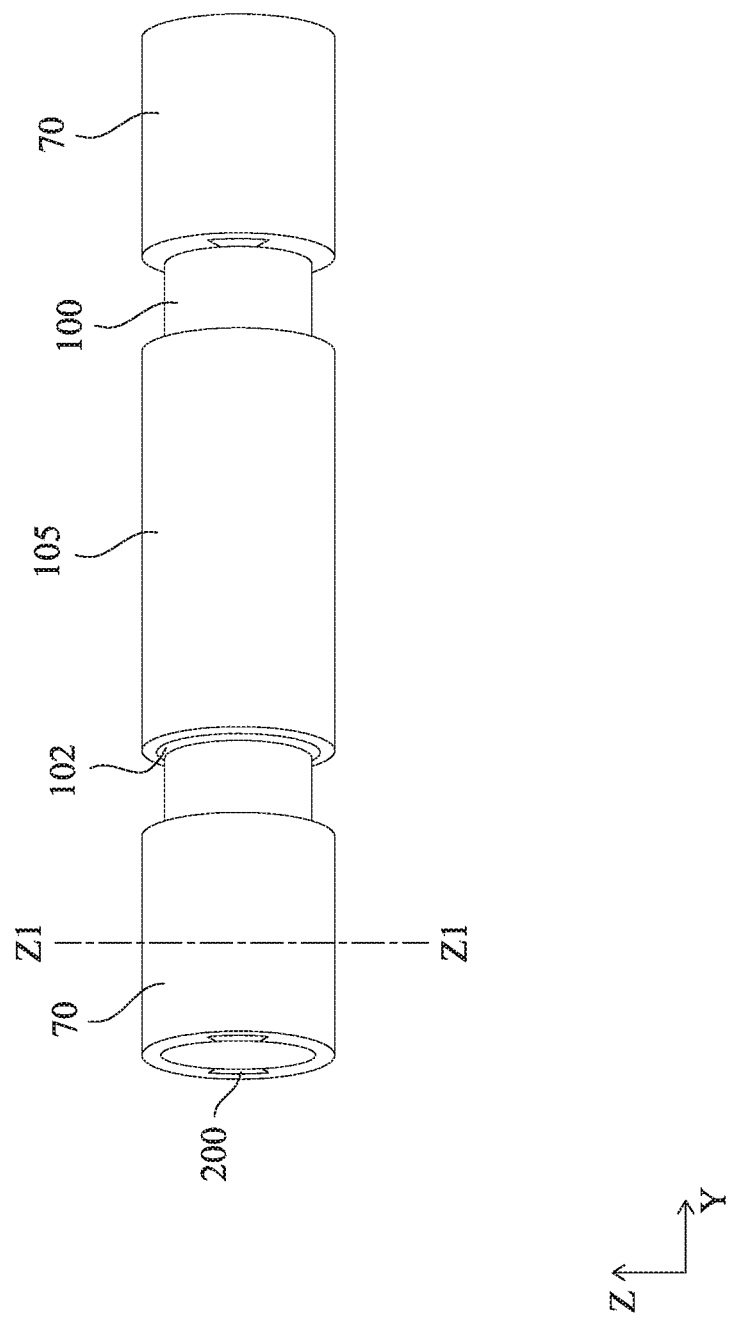
FIG. 1A shows a schematic view of a GAA FET using a carbon nanotube (CNT) in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Carbon nanotubes (CNTs) having diameters in the order of nm (e.g., about 1 nm) are considered a material of choice for making scaled FET device due to their cylindrical geometry, excellent electrical and mechanical properties. A field effect transistor (FET) using a CNT with a gate length about 10 nm or less shows excellent electrical characteristics. However, a fabrication technology compatible with a CMOS fabrication technology has not been established. In the present disclosure, by stacking layers of aligned CNTs on a substrate and forming a fin structure from the stacked CNTs, a horizontal gate all around process flow compatible with a CMOS technology is provided.

In some embodiments, semiconductor devices include a novel structure of field-effect transistors including stacked, gate-all-around (GAA) carbon nanotubes (CNTs). The semiconductor devices include an array of aligned CNTs with a gate dielectric layer wrapping therearound and a gate electrode layer. The GAA FETs with CNTs can be applied to logic circuits in advanced technology node. However, control of the doping profile in CNTs is often challenging. Generally, it is desirable to have an undoped channel region of the GAA FET, while having doped source/drain extension and source/drain contact regions.

In the present disclosure, electrostatic doping techniques to induce charges in the semiconductive CNTs by placing one or more dielectric layers (embedded doping scheme) are employed in the source/drain regions to provide more carriers in the CNTs and to reduce contact resistance.

FIG. 1A shows a schematic view of a GAA FET using a carbon nanotube (CNT) in accordance with an embodiment of the present disclosure.

As shown in FIG. 1A, a gate dielectric layer 102 is disposed around a CNT 100, and a gate electrode 105 is disposed on the gate dielectric layer 102, thereby forming a GAA structure. In the source/drain region, a source/drain contact 70 made of conductive material is also disposed around the CNT 100. In some embodiments, a dielectric layer 200 partially covers the source/drain regions of the CNT 100 such that the source/drain contact 70 is in direct contact with only a part of the CNT 100 and the dielectric layer 200 is disposed between the source/drain contact 70 and the CNT 100.

Figure 1C:
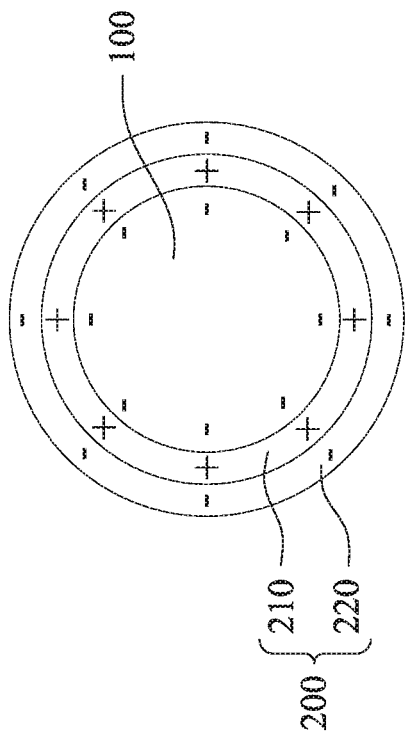
FIGS. 1B, 1C and 1D show embedded doping schemes in accordance with embodiments of the present disclosure.
Figure 1D:
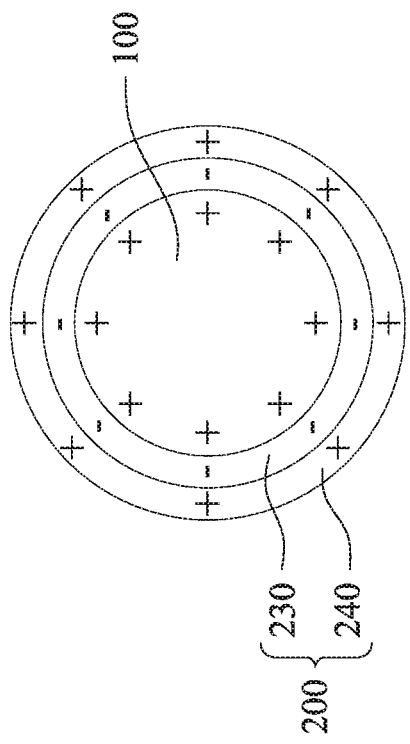
Figure 1B:
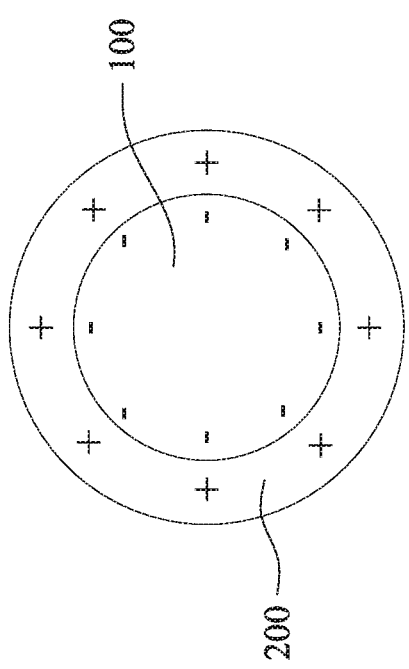

FIGS. 1B-1D show embedded doping schemes in accordance with embodiments of the present disclosure. FIGS. 1B-1D are cross sectional views corresponding to line Z1-Z1 of FIG. 1A. For the purpose of explanation, the dielectric layer 200 fully covers the CNT 100 in FIGS. 1B-1D. However, in the embodiments below, the dielectric layer 200 only partially covers the CNT 100 under the source/drain contact.

In FIG. 1B, a dielectric layer 200 having fixed charges therein wraps around the CNT 100. In some embodiments, the dielectric layer 200 is non-stoichiometric silicon nitride e.g., $SiN_x$). Since the dielectric layer 200 has positive fixed charges, negative mobile charges are induced in the CNT 100 for an n-type FET. The thickness of the dielectric layer 200 is in a range from about 1 nm to about 10 nm in some embodiments. In other embodiments, the dielectric layer 200 carries negative fixed charges, which induces positive mobile charges in the CNT 100 for a p-type FET. The dielectric layer 200 carrying negative fixed charges includes $MoO_3$ or $NiO_2$.

In FIG. 1C, the dielectric layer 200 includes a first dielectric layer 210 in contact with the CNT 100 and a second dielectric layer 220 over the first dielectric layer 210. In some embodiments, the second dielectric layer 220 has negative interfacial charges inside, and the first dielectric layer 210 has positive interfacial charges inside. This dielectric dipole structure at the interface between the first and the second dielectric layers induces negative mobile charges in the CNT 100 for an n-type FET. In some embodiments, the second dielectric layer 220 is made of hafnium oxide (HfO$_2$), and the first dielectric layer is made of aluminum oxide (Al$_2$O$_3$) or aluminum oxynitride (AlO$_x$N$_y$). In other embodiments, the first dielectric layer 210 is silicon oxide (SiO$_2$) and the second dielectric layer 220 is one of Y$_2$O$_3$ and La$_2$O$_3$. The thickness of the first and second dielectric layer 200 is in a range from about 1 nm to about 10 nm in some embodiments. In some embodiments, the dielectric layer 200 includes a first dielectric layer in contact with the CNT, a second dielectric layer disposed over the first dielectric layer and a third dielectric layer disposed over the second dielectric layer, which constitute a dielectric dipole structure at the interface between the first and the second dielectric layers inducing positive charges in the CNT. In some embodiments, the first dielectric layer is made of aluminum oxide, and the second dielectric layer is made of silicon oxide and the third dielectric layer is made of aluminum oxide. The first and third dielectric layers includes other oxides, such as scandium oxide, erbium oxide, molybdenum oxide and nickel oxide.

In FIG. 1D, the dielectric layer 200 includes a third dielectric layer 230 in contact with the CNT 100 and a fourth dielectric layer 240 over the third dielectric layer 230. In some embodiments, the fourth dielectric layer 240 has positive charges inside, and the third dielectric layer 310 has negative charges inside. This dielectric dipole structure at the interface between the first and the second dielectric layers induces positive mobile charges in the CNT 100 for a p-type FET. In some embodiments, the third dielectric layer 230 is silicon oxide (SiO$_2$) and the fourth dielectric layer 240 is one of Al$_2$O$_3$ and HfO$_2$. In other embodiments, the third dielectric layer 230 is aluminum oxynitride (AlO$_x$N$_y$) and the fourth dielectric layer is aluminum oxide (Al$_2$O$_3$). The thickness of the third and fourth dielectric layer 200 is in a range from about 1 nm to about 10 nm in some embodiments.

Figure 2A:
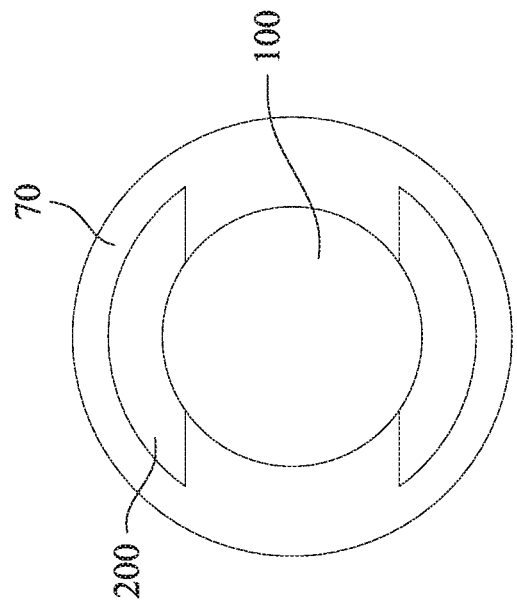
FIGS. 2A, 2B, 2C and 2D illustrate various embedded doping structures in a source/drain region of a GAA FET using a CNT in accordance with embodiments of the present disclosure.
Figure 2B:
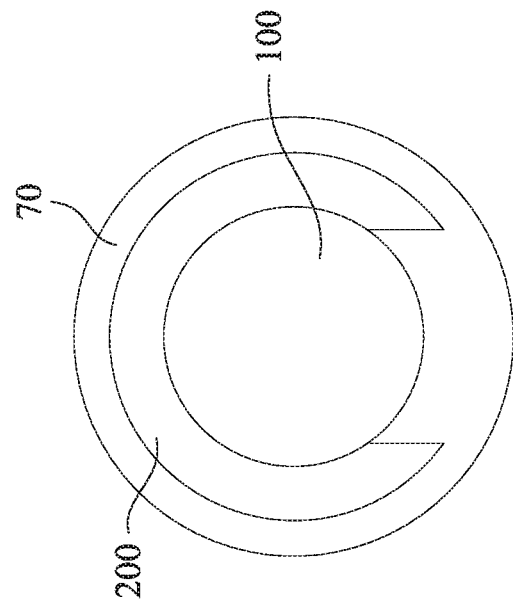
Figure 2C:
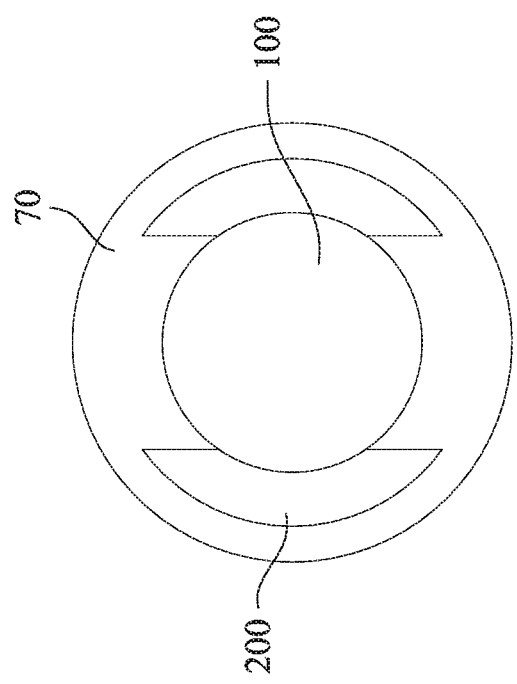
Figure 2D:
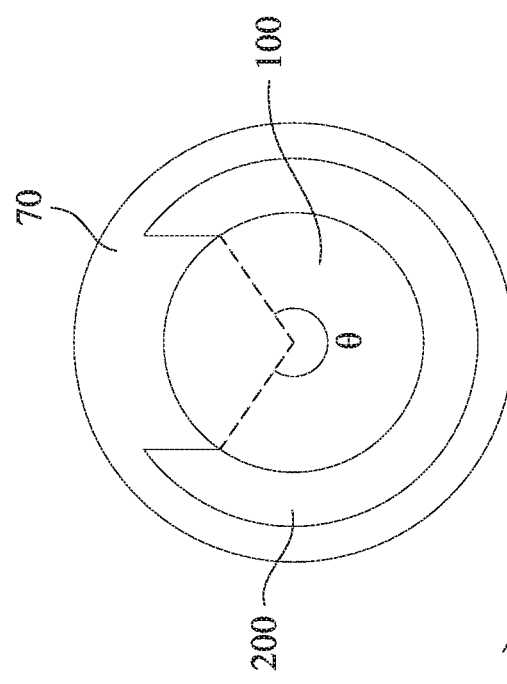

FIGS. 2A-2D illustrate various embedded doping structures in a source/drain region of a GAA FET using a CNT in accordance with embodiments of the present disclosure. As shown in FIGS. 2A-2D, a single layer of the dielectric layer 200 partially covers the CNT 100 under the source/drain contact 70 and the source/drain contact 70 further covers the dielectric layer 200. In FIG. 2A, the left and right portions of the CNT 100 are covered by the dielectric layer 200, while the top and bottom portions of the CNT 100 are in direct contact with the source/drain contact 70. In FIG. 2B, the top and bottom portions of the CNT 100 are covered by the dielectric layer 200, while the left and right portions of the CNT 100 are in direct contact with the source/drain contact 70. In FIG. 2C, the top portion of the CNT 100 is in direct contact with the source/drain contact 70 and the remaining portion of CNT 100 is covered by the dielectric layer 200. In FIG. 2D, the bottom portion of the CNT 100 is in direct contact with the source/drain contact 70 and the remaining portion of CNT 100 is covered by the dielectric layer 200.

Figure 3A:
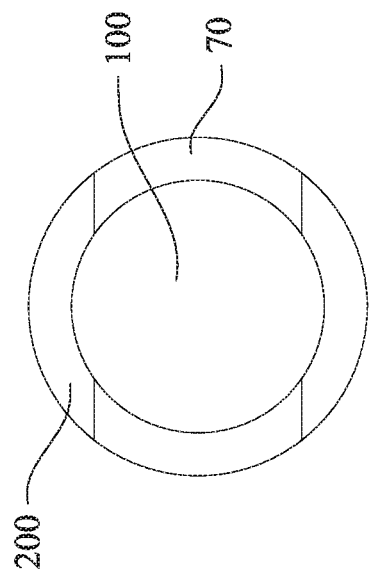
FIGS. 3A, 3B, 3C and 3D illustrate various embedded doping structures in a source/drain region of a GAA FET using a CNT in accordance with embodiments of the present disclosure.
Figure 3B:
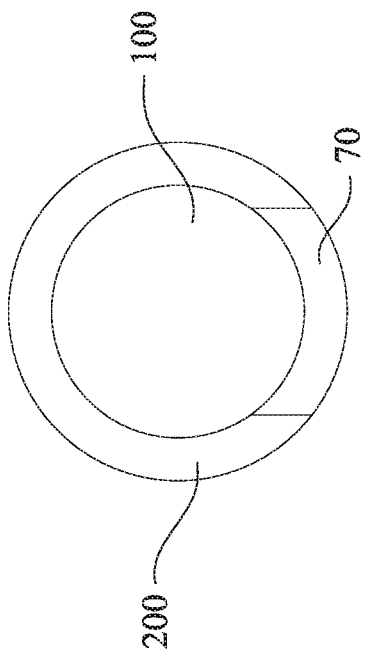
Figure 3C:
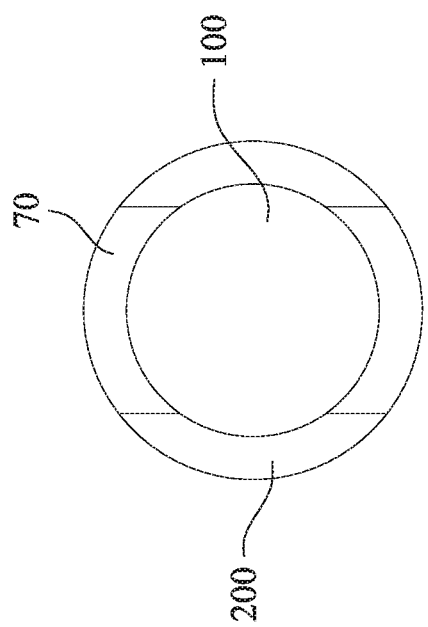
Figure 3D:
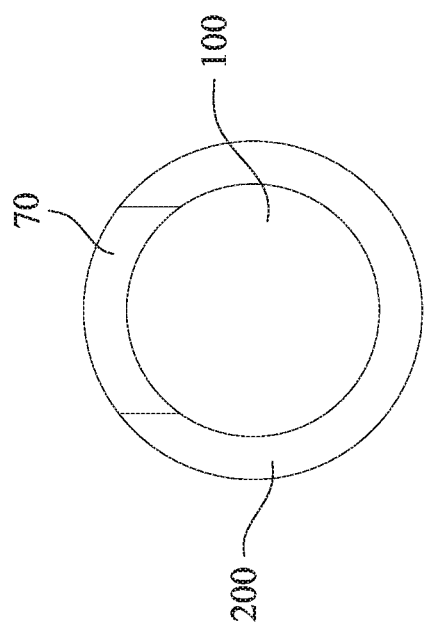

FIGS. 3A-3D illustrate various embedded doping structures in a source/drain region of a GAA FET using a CNT in accordance with embodiments of the present disclosure. As shown in FIGS. 3A-3D, a single layer of the dielectric layer 200 partially covers the CNT 100 under the source/drain contact 70 and the source/drain contact 70 does not cover the dielectric layer 200. In FIG. 3A, the left and right portions of the CNT 100 are covered by the dielectric layer 200, while the top and bottom portions of the CNT 100 are in direct contact with the source/drain contact 70. In FIG. 3B, the top and bottom portions of the CNT 100 are covered by the dielectric layer 200, while the left and right portions of the CNT 100 are in direct contact with the source/drain contact 70. In FIG. 3C, the top portion of the CNT 100 is in direct contact with the source/drain contact 70 and the remaining portion of CNT 100 is covered by the dielectric layer 200. In FIG. 3D, the bottom portion of the CNT 100 is in direct contact with the source/drain contact 70 and the remaining portion of CNT 100 is covered by the dielectric layer 200.

Figure 4A:
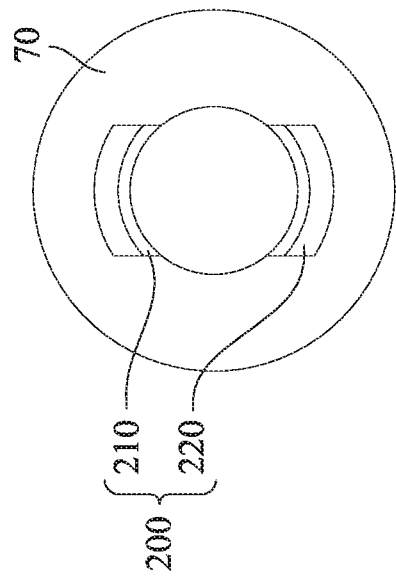
FIGS. 4A, 4B, 4C and 4D illustrate various embedded doping structures in a source/drain region of a GAA FET using a CNT in accordance with embodiments of the present disclosure.
Figure 4B:
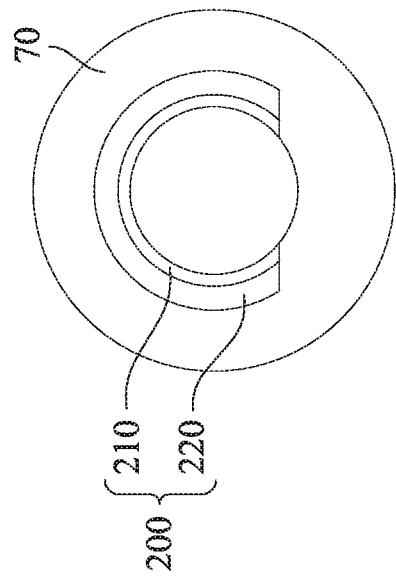
Figure 4C:
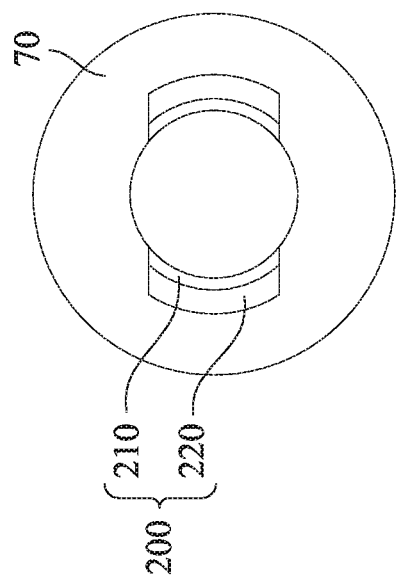
Figure 4D:
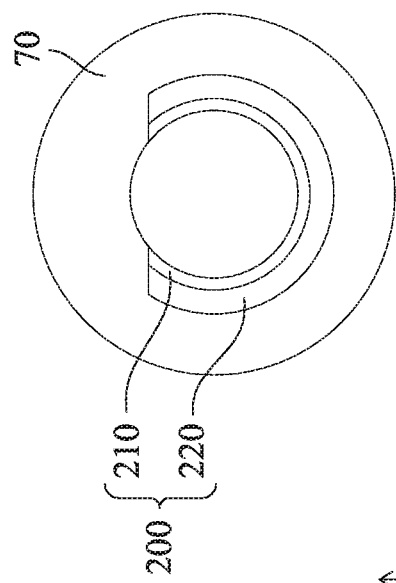

FIGS. 4A-4D illustrate various embedded doping structures in a source/drain region of a GAA FET using a CNT in accordance with embodiments of the present disclosure. As shown in FIGS. 4A-4D, a bi-layer of the dielectric layer 200 including first and second dielectric layers 210 and 220 (or third and fourth dielectric layers 230 and 240 of FIG. 1D) partially covers the CNT 100 under the source/drain contact 70 and the source/drain contact 70 further covers the bi-layer dielectric layer 200. In FIG. 4A, the left and right portions of the CNT 100 are covered by the dielectric layer 200, while the top and bottom portions of the CNT 100 are in direct contact with the source/drain contact 70. In FIG. 4B, the top and bottom portions of the CNT 100 are covered by the dielectric layer 200, while the left and right portions of the CNT 100 are in direct contact with the source/drain contact 70. In FIG. 4C, the top portion of the CNT 100 is in direct contact with the source/drain contact 70 and the remaining portion of CNT 100 is covered by the dielectric layer 200. In FIG. 4D, the bottom portion of the CNT 100 is in direct contact with the source/drain contact 70 and the remaining portion of CNT 100 is covered by the dielectric layer 200.

Figure 5A:
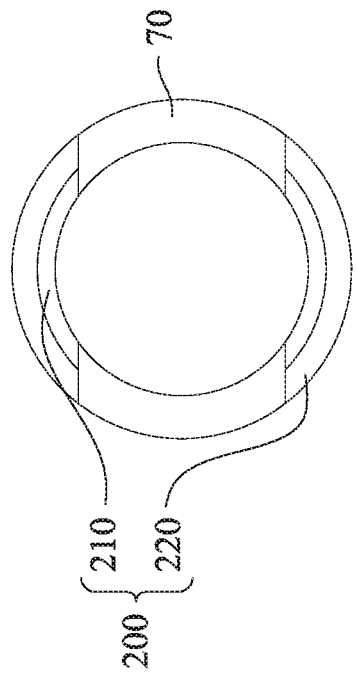
FIGS. 5A, 5B, 5C and 5D illustrate various embedded doping structures in a source/drain region of a GAA FET using a CNT in accordance with embodiments of the present disclosure.
Figure 5B:
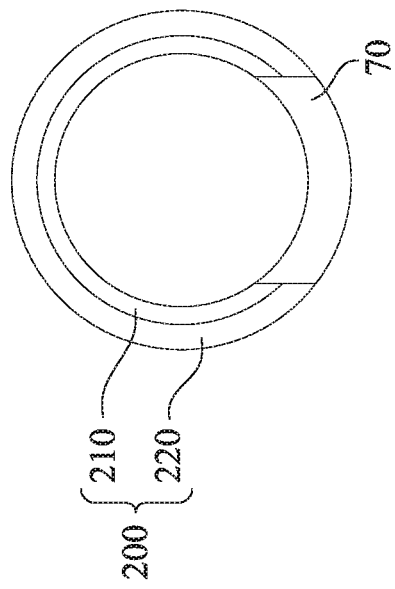
Figure 5C:
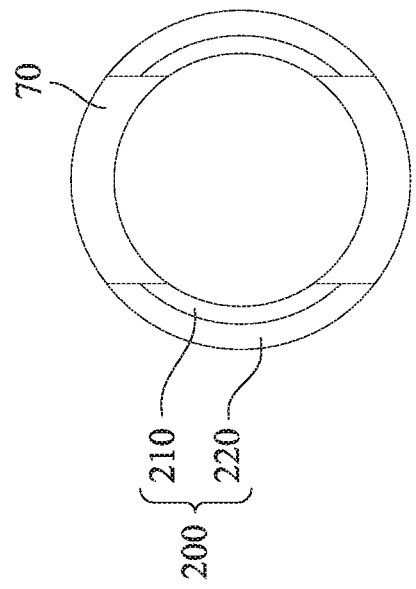
Figure 5D:
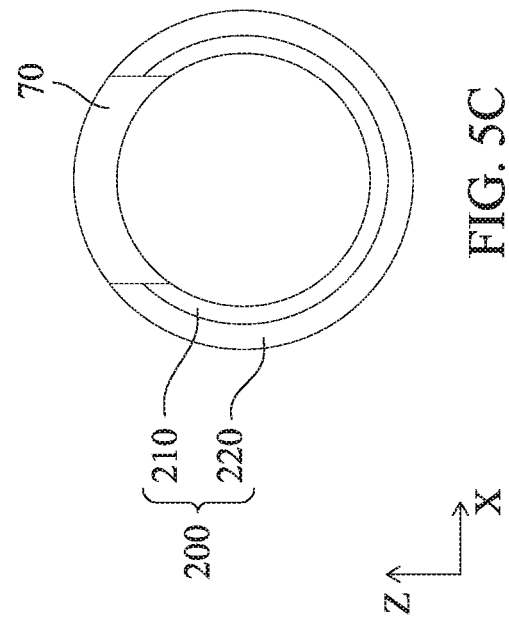

FIGS. 5A-5D illustrate various embedded doping structures in a source/drain region of a GAA FET using a CNT in accordance with embodiments of the present disclosure. As shown in FIGS. 5A-5D, a bi-layer of the dielectric layer 200 including first and second dielectric layer 210 and 220 (or third and fourth dielectric layers 230 and 240 of FIG. 1D) partially covers the CNT 100 under the source/drain contact 70 and the source/drain contact 70 does not cover the dielectric layer 200. In FIG. 5A, the left and right portions of the CNT 100 are covered by the dielectric layer 200, while the top and bottom portions of the CNT 100 are in direct contact with the source/drain contact 70. In FIG. 5B, the top and bottom portions of the CNT 100 are covered by the dielectric layer 200, while the left and right portions of the CNT 100 are in direct contact with the source/drain contact 70. In FIG. 5C, the top portion of the CNT 100 is in direct contact with the source/drain contact 70 and the remaining portion of CNT 100 is covered by the dielectric layer 200. In FIG. 5D, the bottom portion of the CNT 100 is in direct contact with the source/drain contact 70 and the remaining portion of CNT 100 is covered by the dielectric layer 200.

In some embodiments, in the cross section perpendicular to the extending direction of CNT, the dielectric layer 20 covers 25% to 90% of an outer circumference of the CNT 100. For example, as shown in FIG. 2C, the angle θ, which corresponds to the circumference covered by the dielectric layer 200 is in a range from about 90 degrees to 324 degrees. In other embodiments, the angle θ is in a range from about 120 (33.3%) degrees to about 270 (75%) degrees. When the dielectric layer 200 is divided into multiple regions as shown in FIGS. 2A, 2B, 3A, 3B, 4A, 4B, 5A and 5B, the angle θ is the total of angles for respective regions.

In some embodiments, the source/drain contact 70 makes an ohmic contact with the CNT100. In other embodiments, the source/drain contact 70 makes a Schottky contact with the CNT100.

FIGS. 6A-19I illustrate various stages of a sequential fabrication process of a GAA FET using carbon nanotubes in accordance with embodiments of the present disclosure. It is understood that additional operations can be provided before, during, and after processes shown by FIGS. 6A-19I, and some of the operations described below can be replaced or eliminated, for additional embodiments of the method. The order of the operations/processes may be interchangeable. Materials, configurations, dimensions, processes and/or operations the same as or similar to those described with respect to FIGS. 1A-5D may be employed in the following embodiments and the detailed explanation may be omitted.

Figure 6A:
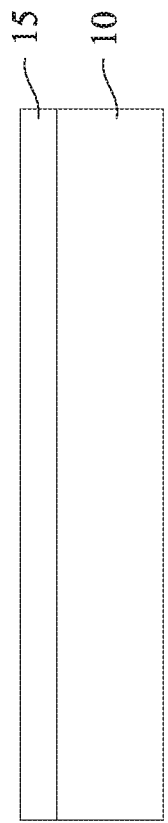
FIGS. 6A, 6B, 6C, 6D, 6E, and 6F show various stages of a sequential fabrication process of a GAA FET using a CNT in accordance with an embodiment of the present disclosure.

As shown in FIG. 6A, a bottom support layer 15 is formed over a substrate 10. In some embodiments, the substrate 10 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. An insulating material, such as a glass, may be used as the substrate. The bottom support layer 15 is made of an insulating material in some embodiments. In some embodiments, the bottom support layer includes one or more layers of silicon oxide, silicon nitride, SiON, SiOC, SiOCN and SiCN, or other suitable insulating material. In other embodiments, the bottom support layer includes a polycrystalline or amorphous material of one of Si, Ge and SiGe. The bottom support layer 15 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the bottom support layer 15.

Figure 6B:
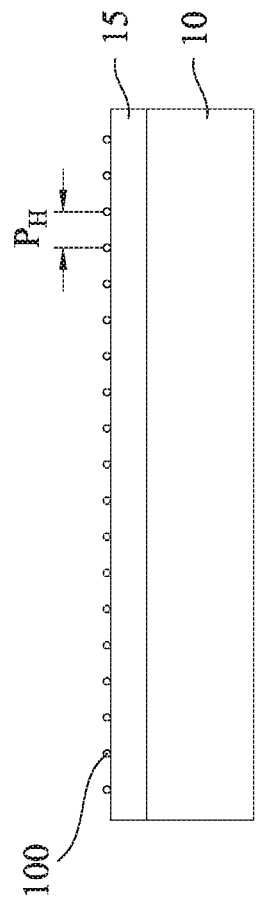

Then, as shown in FIG. 6B, one or more carbon nanotubes (CNTs) 100 are arranged over the bottom support layer 15. In some embodiments, the bottom support layer is not used and the CNTs 100 are directly disposed on the substrate 10. The CNTs are arranged on the bottom support layer 15 aligned with the substantially same direction (e.g., Y direction). The deviation from the Y direction of the alignment of the CNTs 100 is about ±10 degrees in some embodiments, and is about ±5 degrees in other embodiments. In certain embodiments, the deviation is about +2 degrees. The CNTs 100 are arranged with a density in a range from about 50 tubes/μm to about 300 tubes/μm along the X direction in some embodiments, and in other embodiments, the density is in a range from about 100 tubes/μm to about 200 tubes/μm along the X direction. The length of the CNTs 100 (in the Y direction) is in a range from about 0.5 μm to about 5 μm in some embodiments, and is in a range from about 1 μm to about 2 μm in other embodiments. The average diameter of the CNTs 100 is in a range from about 1.0 nm to about 2.0 nm in some embodiments.

Carbon nanotubes can be formed by various methods, such as CVD with metallic catalysts on a substrate (e.g., quartz or sapphire), arc-discharge or laser ablation methods. The formed CNTs are dispersed in a solvent, such as sodium dodecyl sulfate (SDS). The CNTs can be transferred to and disposed on a substrate using various methods, such as a floating evaporative self-assembly method in some embodiments.

Figure 6C:
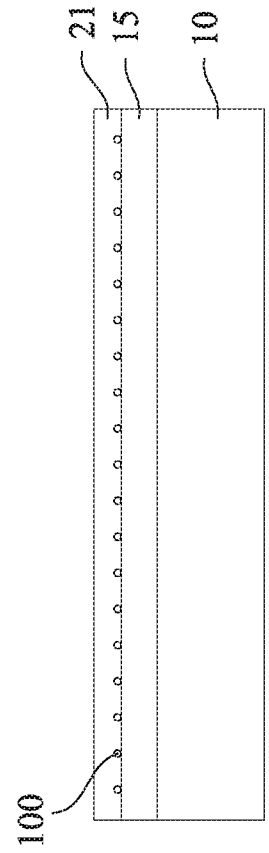

After the CNTs 100 are transferred onto the bottom support layer 15, a first support layer 21 is formed over the CNTs (a first group of CNTs) disposed on the bottom support layer 15, as shown in FIG. 6C. In some embodiments, the first support layer 21 includes a polycrystalline or amorphous material of one of Si, Ge and SiGe. In other embodiments, the first support layer 21 includes one or more layers of silicon oxide, silicon nitride, SiON, SiOC, SiOCN and SiCN, or other suitable insulating material. In some embodiments, the first support layer 21 includes organic material, such as organic polymers. In certain embodiments, the first support layer 21 is made of a different material than the bottom support layer 15. In other embodiments, the first support layer 21 is made of the same material as the bottom support layer 15. The first support layer 21 can be formed by suitable film formation methods, such as CVD, PVD or ALD. In one embodiment, ALD is used for its high thickness uniformity and thickness controllability.

In some embodiments, when the first support layer is conformally formed over the first group of CNTs 100, the upper surface of the first support layer has a wavy shape having peaks and valleys. The thickness of the first support layer 21 is in a range from about 2 nm to about 10 nm in some embodiments, and is in a range from about 3 nm to 5 nm in other embodiments. In other embodiments, after the first support layer 21 is formed with the wavy upper surface, one or more planarization operations are performed to flatten the upper surface of the support layer 21. The planarization operation includes an etch-back process or a chemical mechanical polishing (CMP) process. In one embodiment, CMP is used.

Figure 6D:
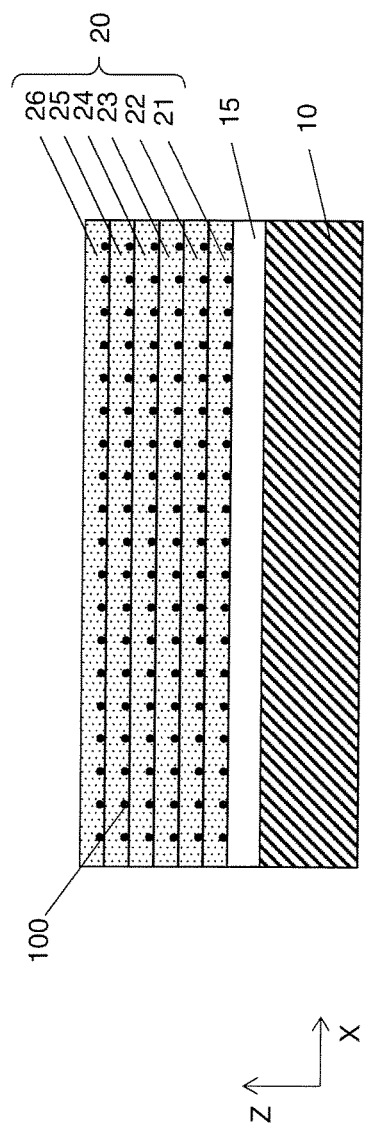

Then, a second support layer 22 is formed over the first support layer 21 as shown in FIG. 6D. In some embodiments, the second support layer 22 is made of the same material as the first support layer 21 in some embodiments. The thickness of the second support layer 22 is substantially the same as the thickness of the first support layer 21. The difference in the thickness is within ±5% in some embodiments with respect to the average thickness.

Further, a second group of CNTs 100 are disposed on the second support layer 22 as shown in FIG. 6D. When the upper surface of the first support layer has the wavy shape, the second group of CNTs 100 tend to be arranged at the valleys of the wavy shape.

In some embodiments, forming a group of CNTs and forming a support layer are repeated to form n support layers in each of which CNTs are embedded, where n is integer of three or more. In some embodiments, n is up to 20. FIG. 6D shows one embodiment, in which six support layers 21, 22, 23, 24, 25 and 26 are formed, thus forming six layers of CNTs disposed in a support layer 20. In the following explanation, the first to sixth support layers 21-26 are referred to as a support layer 20.

In FIG. 6D, the CNTs 100 in one layer are arranged in a substantially constant pitch and the CNTs in the vertical direction are aligned. However, the arrangement of the CNTs in the support layer 20 is not limited to those of FIG. 6D. In some embodiments, the CNTs in one layer have random pitch in the X direction. When the average diameter of the CNTs 100 is $D_{CNT}$, horizontal pitch $P_H$ of the CNTs is $D_{CNT} \leq P_H \leq 10 \times D_{CNT}$, in some embodiments. In some embodiments, two adjacent CNTs are in contact with each other. Further, in the vertical direction, at least two CNTs 100 in different layers are not aligned with each other, in some embodiments. The vertical pitch $P_V$ of the CNTs 100 is determined by the thickness of the support layers. In some embodiments, a vertical pitch $P_V$ of the CNTs 100 in adjacent layers is $0.9 \times P_A \leq P_V \leq 1.1 \times P_A$, where $P_A$ is an average pitch of the multiple layers. In other embodiments, the vertical pitch $P_V$ is $0.95 \times P_A \leq P_V \leq 1.05 \times P_A$.

Figure 7D:
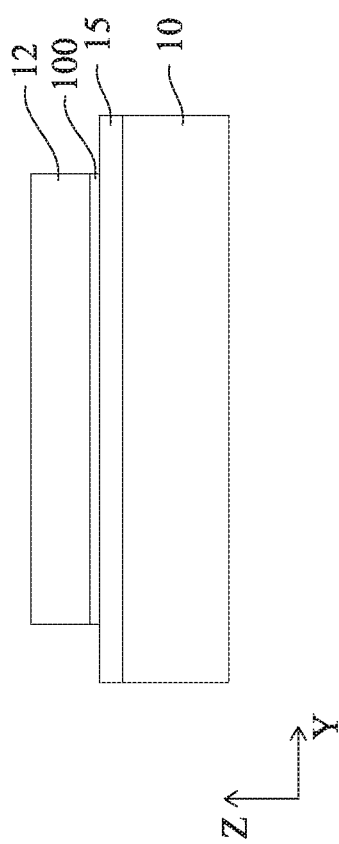
Figure 7E:
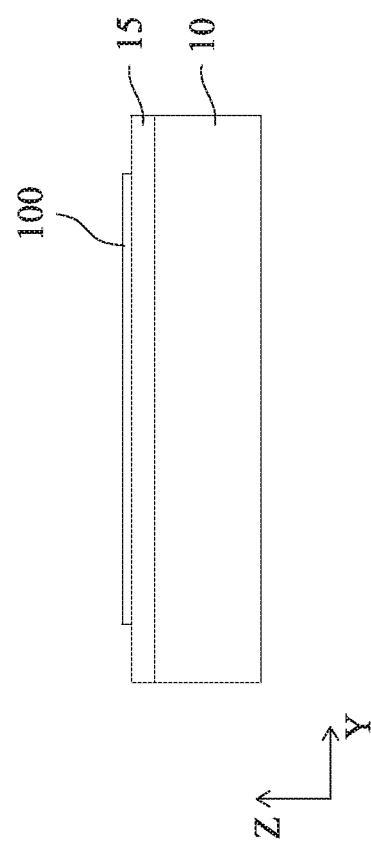

In some embodiments, after the CNTs 100 are transferred over the substrate 10, a trimming process as shown in FIGS. 7A-7E is performed. After the CNTs 100 are transferred onto the bottom support layer 15 as shown in FIGS. 7A and 7B, by using a lithography operation, a photo resist pattern 12, as a cover layer, is formed over a center part of the CNTs 100. End portions of the CNTs 100 are exposed, as shown in FIG. 7C. The width W21 of the photo resist pattern 12 is in a range from about 50 nm to about 2000 nm in some embodiments, and is in a range from about 100 nm to about 1000 nm in other embodiments. Then, the exposed end portions of the CNTs 100 are removed by etching, as shown in FIG. 7D. Further, as shown in FIG. 7E, the resist pattern 12 is then removed by dry etching and/or wet removal using an organic solvent.

Figure 6E:
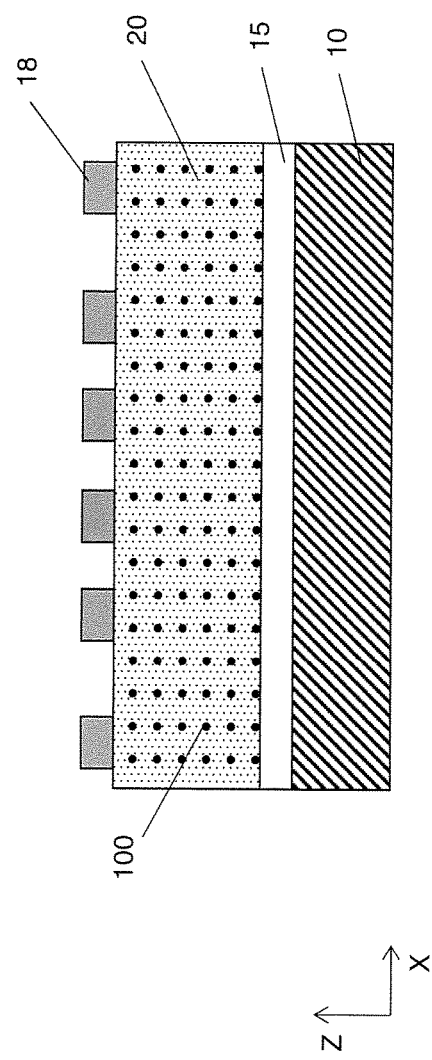
Figure 6F:
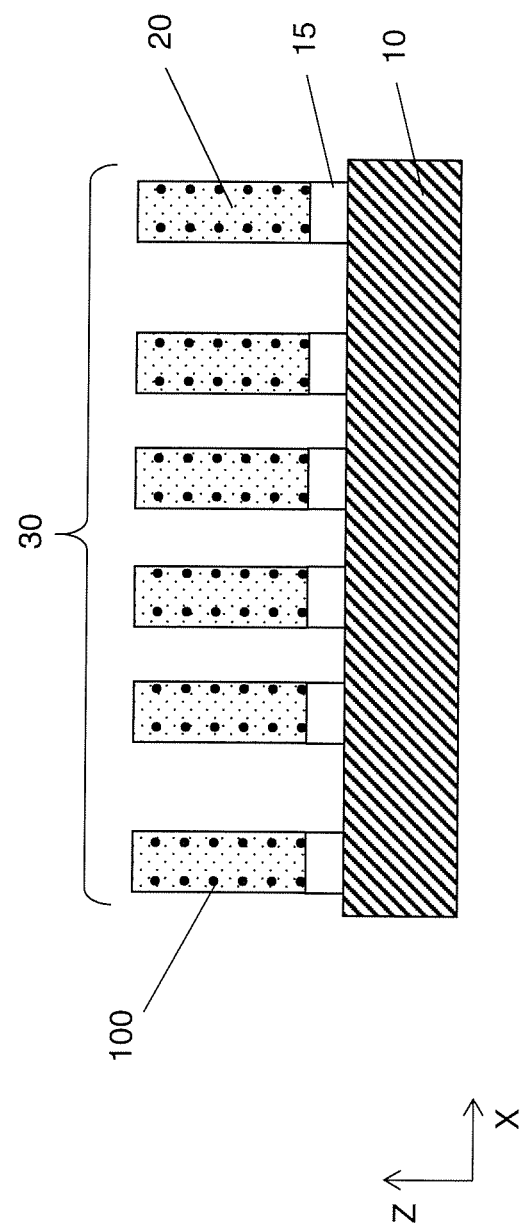

Adverting to FIG. 6E, by using one or more lithography and etching operations, a mask pattern 18 is formed over the support layer 20, and the support layer 20 with the CNTs 100 is patterned into one or more fin structures 30 as shown in FIG. 6F. The mask pattern 18 is a photo resist layer in some embodiments, and can be a hard mask made of dielectric material in other embodiments. In some embodiments, the fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

In some embodiments, the width of the fin structures 30 in the X direction is in a range from about 5 nm to about 20 nm, and is in a range from about 7 nm to about 12 nm in other embodiments. When the bottom support layer 15 is made of the same material as or similar material the support layers 20, the bottom support layer 15 is also patterned into fin structure as shown in FIG. 6F. In other embodiments, when the bottom support layer 15 is made of a different material than the support layers 20, the bottom support layer 15 is not patterned.

The total number of the CNTs 100 per fin structure is in a range from about 5 to about 100 in some embodiments, and is in a range from about 10 about 50 in other embodiments.

Subsequently, a sacrificial gate structure 40 is formed over the fin structures 30 as shown in FIGS. 8A and 8B. FIG. 8A is a cross sectional view along the X direction and the FIG. 8B is a cross sectional view along the Y direction. The sacrificial gate structure 40 is formed by blanket depositing a sacrificial gate electrode layer over the fin structures 30 such that the fin structures 30 are fully embedded in the sacrificial gate electrode layer. The sacrificial gate electrode layer includes silicon, germanium or silicon germanium, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate electrode layer is deposited using CVD, including LPCVD and PECVD, PVD, ALD, or other suitable process. In some embodiments, no sacrificial gate dielectric layer is formed between the fin structure 30 and the sacrificial gate electrode layer, and in other embodiments, a sacrificial gate dielectric layer is formed between the fin structure 30 and the sacrificial gate electrode layer.

Subsequently, a mask layer 42 is formed over the sacrificial gate electrode layer 40. The mask layer 42 includes one or more of a silicon nitride (SiN) layer and a silicon oxide layer. Next, a patterning operation is performed on the mask layer and the sacrificial gate electrode layer is patterned into the sacrificial gate structure 40, as shown in FIGS. 8A and 8B. By patterning the sacrificial gate structure, the fin structures 30 are partially exposed on opposite sides of the sacrificial gate structure 40, thereby defining source/drain (S/D) regions, as shown in FIG. 8B. In this disclosure, a source and a drain are interchangeably used and the structures thereof are substantially the same. In FIGS. 8A and 8B, two sacrificial gate structures 40 are formed over two fin structures 30, but the number of the sacrificial gate structures is not limited to this configuration. One or more than two sacrificial gate structures can be arranged in the Y direction in some embodiments. In certain embodiments, one or more dummy sacrificial gate structures are formed on both sides of the sacrificial gate structures to improve pattern fidelity.

Figure 9B:
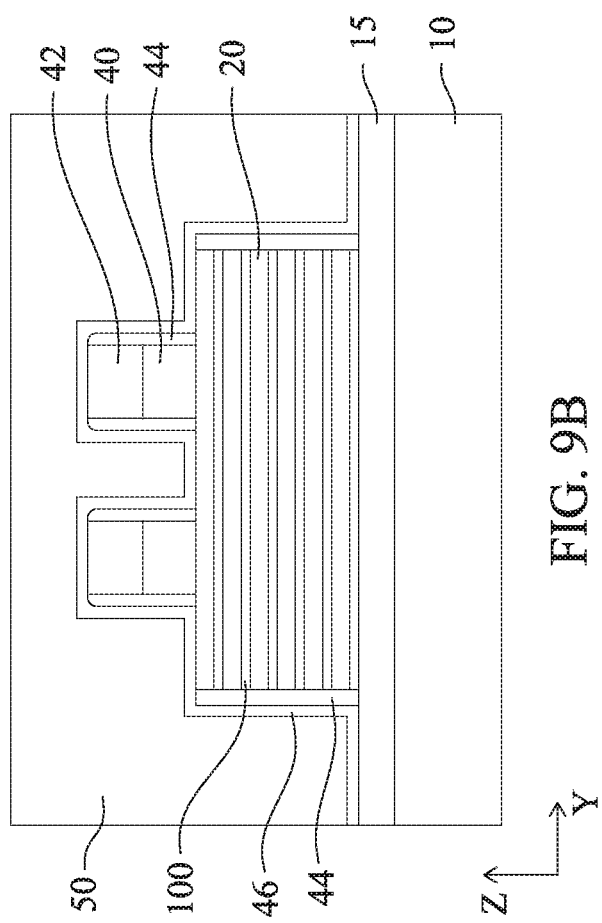
FIGS. 9A and 9B illustrate one of the various stages of a sequential fabrication process of a GAA FET using a CNT in accordance with an embodiment of the present disclosure.
Figure 9A:
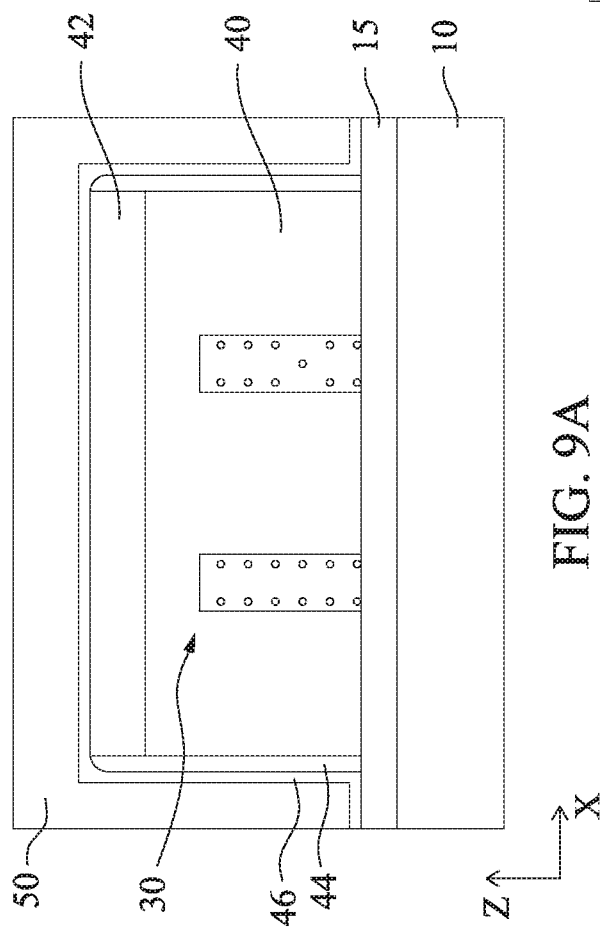

After the sacrificial gate structure 40 is formed, a blanket layer, of an insulating material for gate sidewall spacers 44 is conformally formed by using CVD or other suitable methods, as shown in FIGS. 9A and 9B. The blanket layer is deposited in a conformal manner so that it is formed to have substantially equal thicknesses on vertical surfaces, such as the sidewalls, horizontal surfaces, and the top of the sacrificial gate structures 40. In some embodiments, the blanket layer is deposited to a thickness in a range from about 2 nm to about 10 nm. In some embodiments, the insulating material of the blanket layer is a silicon nitride-based material, such as SiN, SiON, SiOCN or SiCN and combinations thereof. In certain embodiments, the insulating material is one of SiOC, SiCON and SiCN. As understood from FIGS. 8B and 8B, in some embodiments, the CNTs 100 are supported by the support layer 20 but are not supported (anchored) by the sidewall spacers 44. In some embodiments, before the blanket layer for the sidewall spacers 44 is formed, the support layer 20 is, slightly etched to expose the ends of the CNTs 100. In such a case, the ends of the CNTs 100 are supported (anchored) by the sidewall spacers 44.

Further, as shown in FIGS. 9A and 9B, the gate sidewall spacers 44 are formed on opposite sidewalls of the sacrificial gate structures 40 by anisotropic etching. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces, such as the sidewalls of the sacrificial gate structures and the sidewalls of the exposed fin structures. The mask layer 42 may be exposed from the sidewall spacers. In some embodiments, an isotropic etching process may be subsequently performed to remove the insulating material from the upper portions of the S/D region of the exposed fin structures 30.

Subsequently, a liner layer 46, such as an etch stop layer, is formed to cover the gate structures 40 with the sidewall spacer 44 and the exposed fin structures 30. In some embodiments, the liner layer 46 includes a silicon nitride-based material, such as silicon nitride, SiON, SiOCN or SiCN and combinations thereof, formed by CVD, including LPCVD and PECVD, PVD, ALD, or other suitable process. In certain embodiments, the liner layer 46 is made of silicon nitride. Further, as shown in FIGS. 9A and 9B, a first interlayer dielectric (ILD) layer 50 is formed. The materials for the first ILD layer 50 include compounds comprising Si, O, C and/or H, such as silicon oxide, SiCOH and SiOC. Organic materials, such as polymers, may be used for the first ILD layer 50.

Figure 10A:
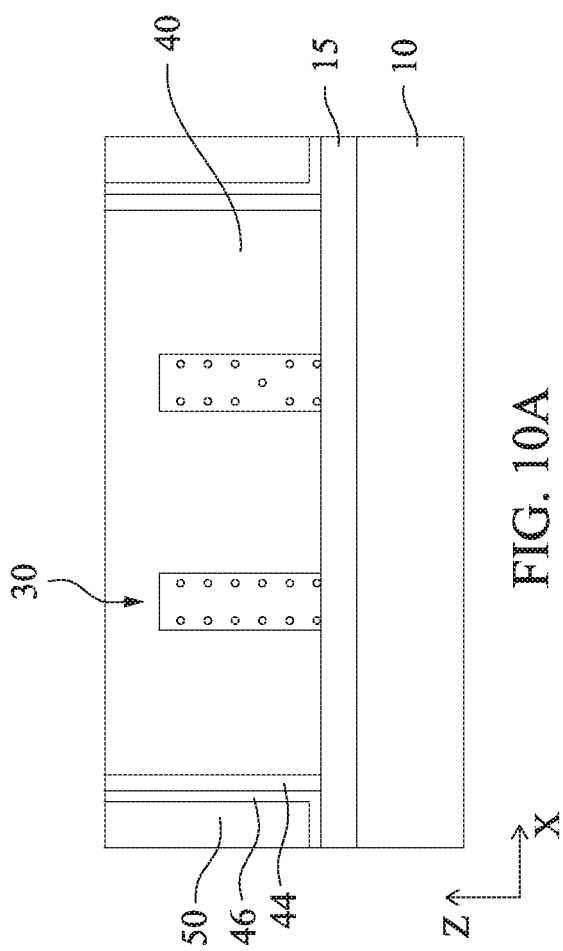
FIGS. 10A and 10B illustrate one of the various stages of a sequential fabrication process of a GAA FET using a CNT in accordance with an embodiment of the present disclosure.
Figure 10B:
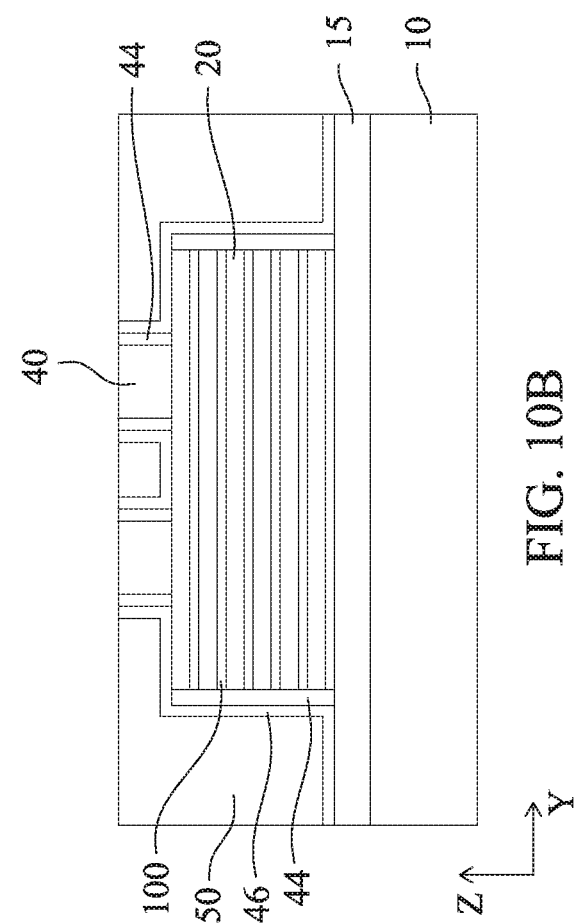
Figure 11A:
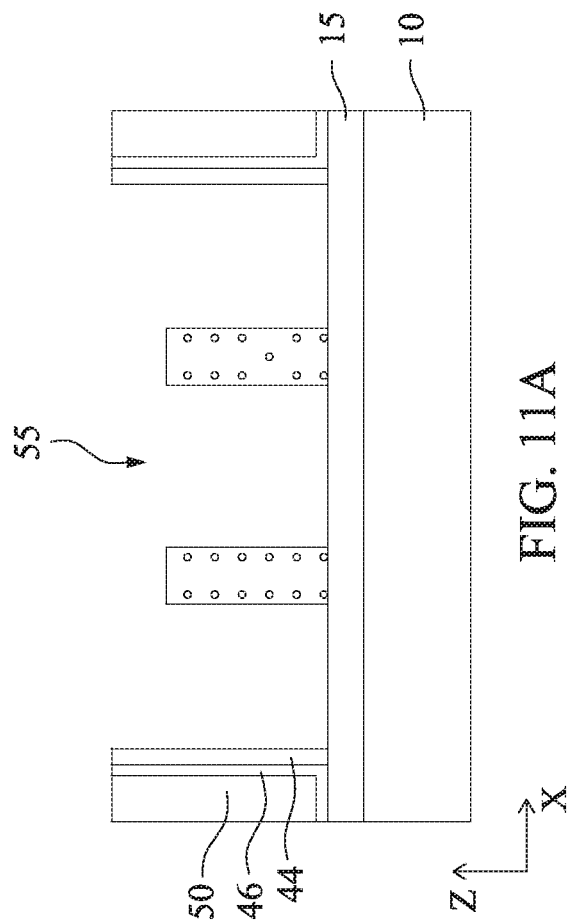
FIGS. 11A and 11B illustrate one of the various stages of a sequential fabrication process of a GAA FET using a CNT in accordance with an embodiment of the present disclosure.
Figure 11B:
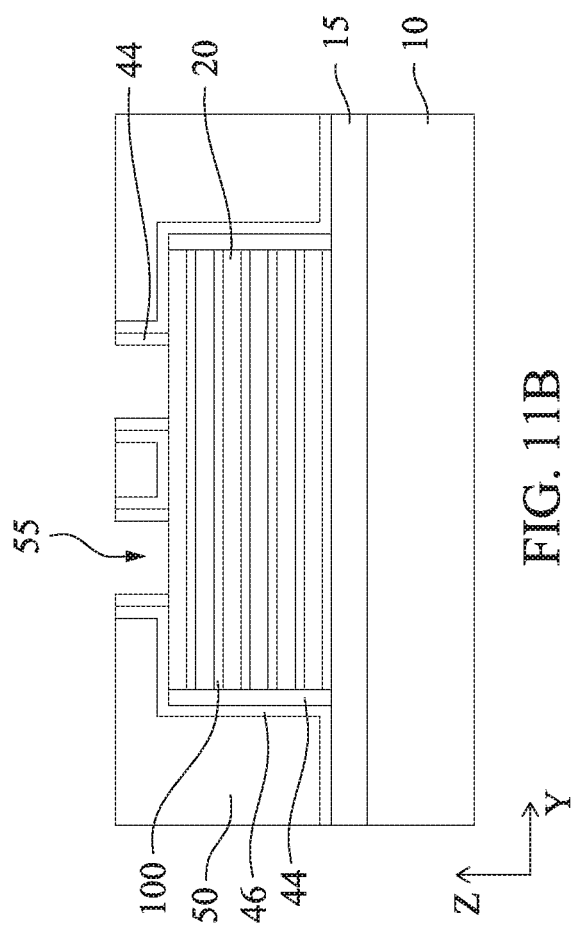

After the first ILD layer 50 is formed, a planarization operation, such as CMP, is performed, so that the sacrificial gate electrode layer 40 is exposed, as shown in FIGS. 10A and 10B. Then, as shown in FIGS. 11A and 11B, the sacrificial gate electrode layer 40 is removed, thereby exposing a channel region of the fin structures in a gate space 55. The sacrificial gate structure 40 can be removed using plasma dry etching and/or wet etching. When the sacrificial gate electrode layer 40 is polysilicon and the first ILD layer 50 is silicon oxide, a wet etchant such as a TMAH solution can be used to selectively remove the sacrificial gate electrode layer 40.

Figure 12A:
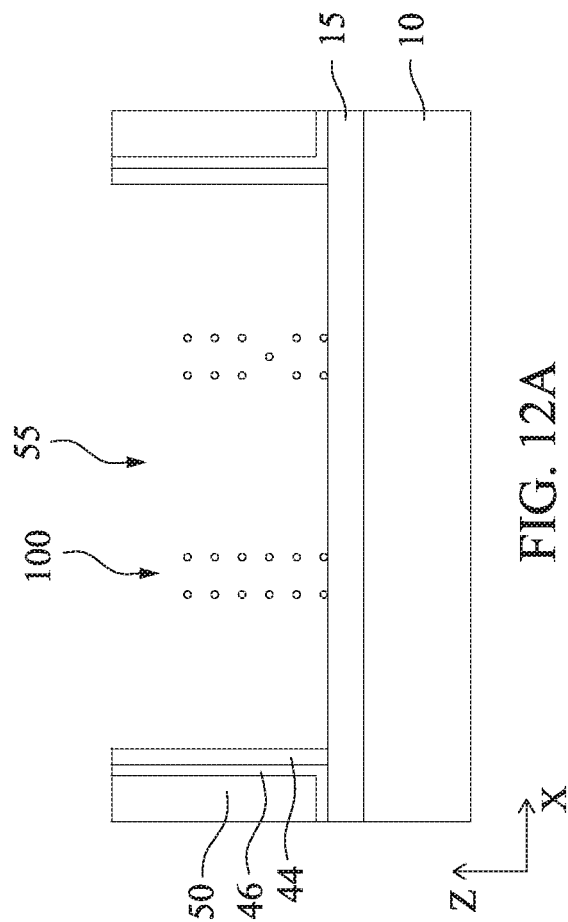
FIGS. 12A and 12B illustrate one of the various stages of a sequential fabrication process of a GAA FET using a CNT in accordance with an embodiment of the present disclosure.
Figure 12B:
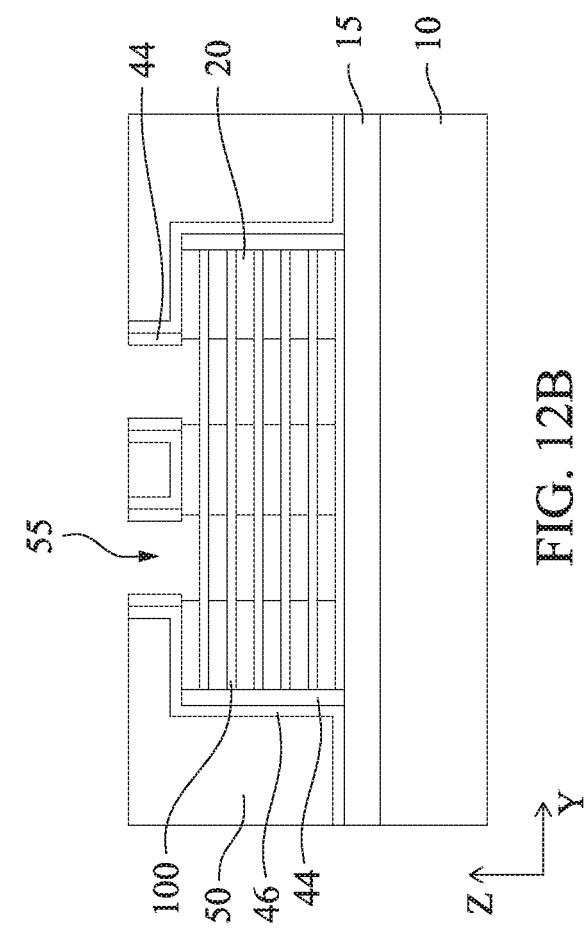

Further, as shown in FIGS. 12A and 12B, the support layer 20 in the gate space 55 is removed to release the CNTs 100. The support layer 20 can be removed selectively to the CNTs 100 using plasma dry etching and/or wet etching. When the support layer 20 is polysilicon or amorphous silicon and the first ILD layer 50 is silicon oxide, a wet etchant such as a TMAH solution is used. When the sacrificial gate electrode layer 40 and the support layer 20 are made of the same material, the removal of the sacrificial gate electrode layer 40 and the removal of the support layer 20 are performed by the same etching operation.

Figure 13A:
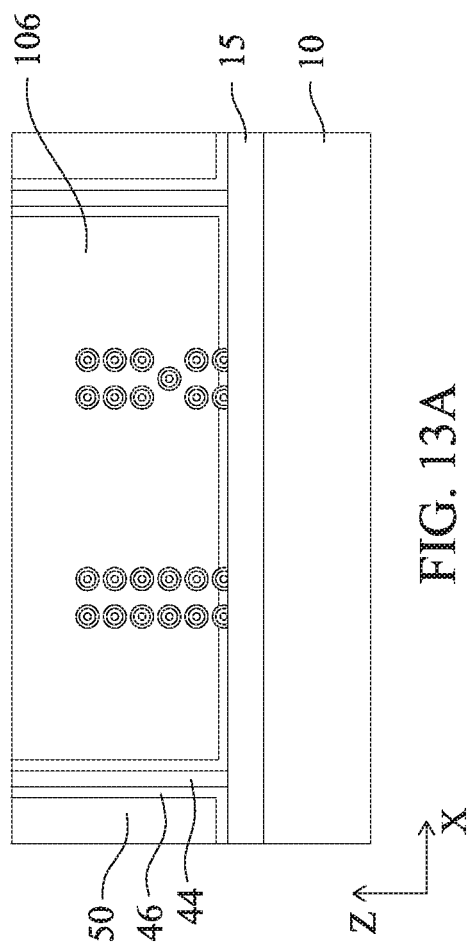
FIGS. 13A, 13B and 13C illustrate one of the various stages of a sequential fabrication process of a GAA FET using a CNT in accordance with an embodiment of the present disclosure.
Figure 13B:
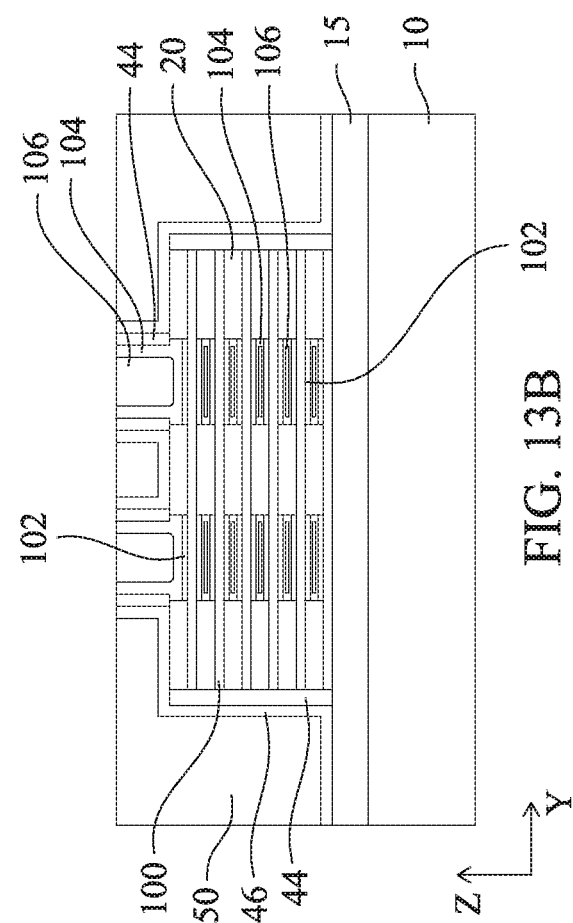
Figure 13C:
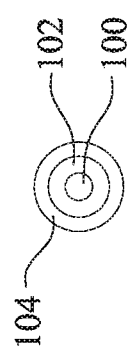

After the channel regions of the CNTs 100 are released, a gate dielectric layer 102 is formed around the CNTs 100, as shown in FIGS. 13A-13C. FIG. 13C is an enlarged view of the gate structure. In some embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 is made of $HfO_2$ for an n-channel FET, and is made of $Al_2O_3$ for a p-channel FET. The gate dielectric layer 102 has a thickness in a range from about 0.5 nm to about 2.5 nm in some embodiments, and has a thickness in a range from about 1.0 nm to about 2.0 nm in other embodiments. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel region of the CNTs 100.

In some embodiments, an interfacial layer (not shown) is formed around the CNTs before the gate dielectric layer 102 is formed. The interfacial layer is made of, for example, $SiO_2$ and has a thickness in a range from about 0.5 nm to about 1.5 nm in some embodiments. In other embodiments, the thickness of the interfacial layer is in a range from about 0.6 nm to about 1.0 nm.

In certain embodiments, one or more work function adjustment layers 104 are formed on the gate dielectric layer 102. The work function adjustment layers 104 are made, of a conductive material such as a single layer of TiN, TaN, TaAlC, TiC, TaC, Co, Al, TiAl, TiSi, TaSi or TiAlC, or a multilayer of two or more of these materials. In certain embodiments, TiN is used as the work function adjustment layer 104. The work function adjustment layer 104 may be formed by ALD, PVD, CVD, e-beam evaporation, or other suitable process. Further, the work function adjustment layer 104 may be formed separately for the n-channel FET and the p-channel FET which may use different metal layers.

Then, as shown in FIGS. 13A and 13B, a gate electrode layer 106 is formed over the work function adjustment layer 104. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 106 may be formed by CVD, ALD, electroplating, or other suitable method. The gate electrode layer 106 is also deposited over the upper surface of the first ILD layer 50, and the gate dielectric layer 102, the work function adjustment layer 104 and the gate electrode layer 106 formed over the first ILD layer 50 are then planarized by using, for example, CMP, until the first ILD layer 50 is revealed.

Figure 14A:
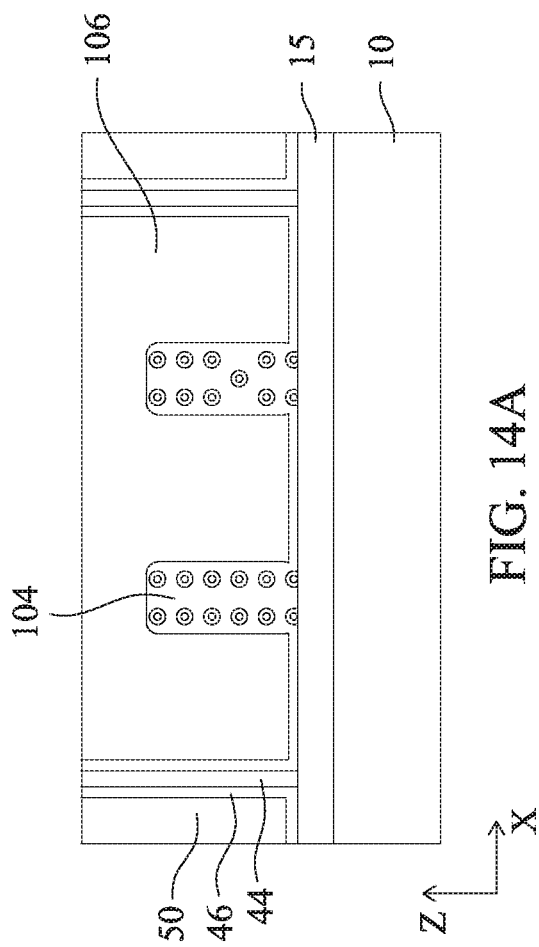
FIGS. 14A and 14B illustrate one of the various stages of a sequential fabrication process of a GAA FET using a CNT in accordance with an embodiment of the present disclosure.
Figure 14B:
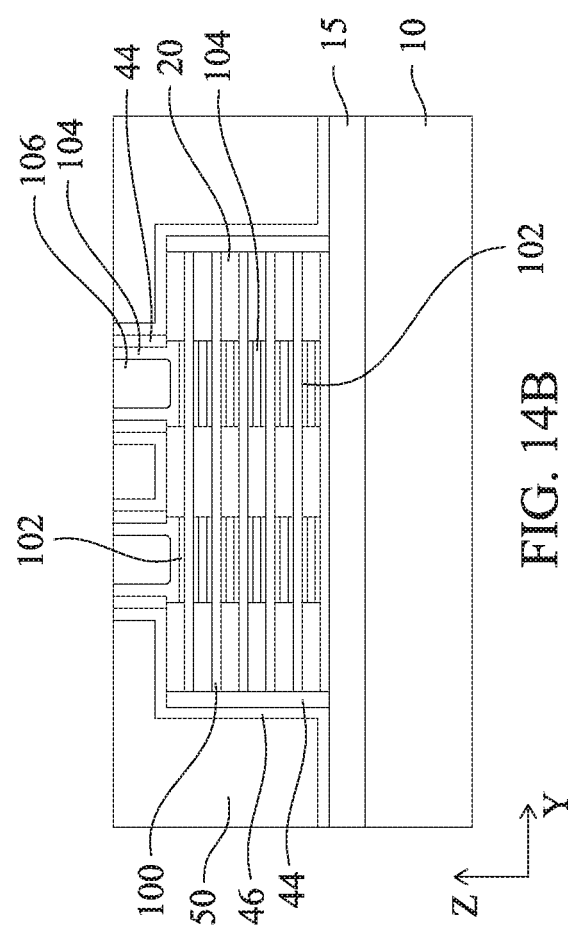

In FIGS. 13A and 13B, the gate dielectric layer fully wraps around each of the CNTs 100, the work function adjustment layer 104 also fully wraps around each of the CNTs 100, and spaces formed between the work function adjustment layer 104 of adjacent CNTs 100 are filled by the gate electrode layer 106. In other embodiments, as shown in FIGS. 14A and 14B, the work function adjustment layer 104 fills spaces between the gate dielectric layer 102 of adjacent CNTs 100, and the gate electrode layer 106 covers outer surface of the work function adjustment layer 104.

Figure 15A:
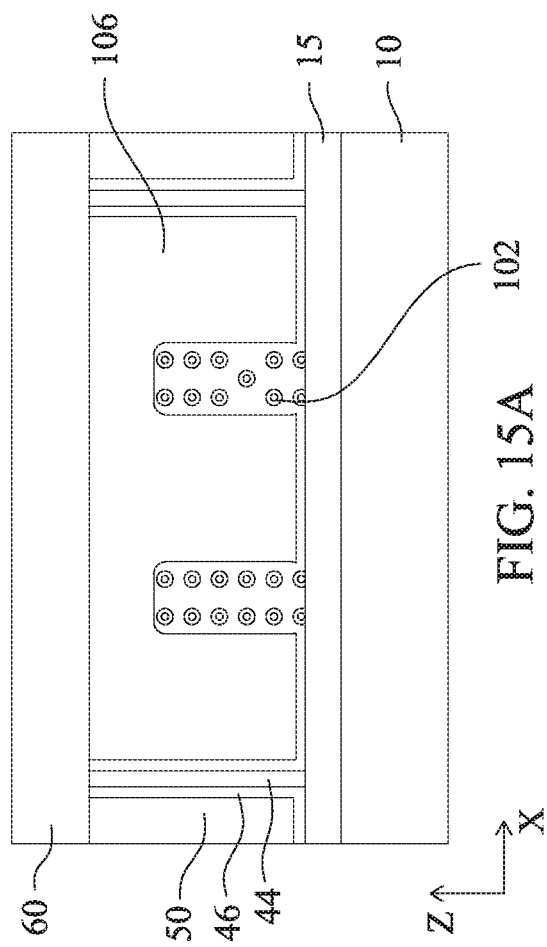
FIGS. 15A and 15B illustrate one of the various stages of a sequential fabrication process of a GAA FET using a CNT in accordance with an embodiment of the present disclosure.
Figure 15B:
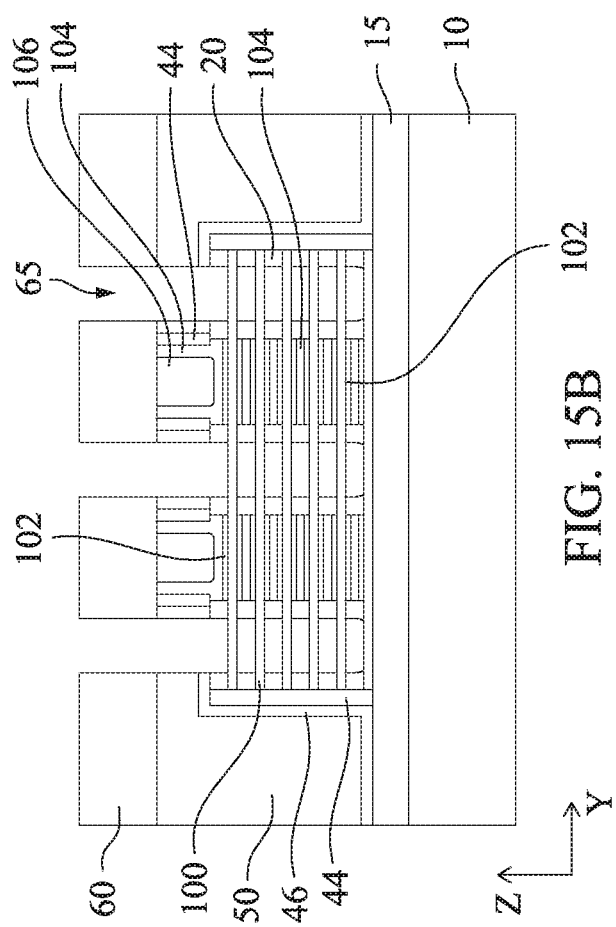

Then, as shown in FIGS. 15A and 15B, a second ILD layer 60 is formed over the first ILD layer 50, and source/drain contact openings 65 are formed by using one or more lithography and etching operations. By this operation, the support layer 20 is removed and thus the source/drain regions of the CNTs 100 are exposed in the source/drain contact openings 65. In some embodiments, as shown in FIG. 15B, a part of the support layer 20 remains under the sidewall spacers 44. When the support layer 20 is made of a dielectric material, the remaining support layer 20 functions as inner spacers separating the gate electrode layer 106 and subsequently formed source/drain contact 70/72.

Subsequently, as shown in FIG. 16A, the dielectric layer 200 is formed around the exposed CNTs 100. In some embodiments, the dielectric layer 200 is a single layer and in other embodiments, the dielectric layer 200 is a bi-layer structure. In certain embodiments, three or more dielectric layers are formed as the dielectric layer 200. In some embodiments, the dielectric layer 200 is formed by ALD or CVD or any suitable film formation methods.

In some embodiments, as shown in FIG. 16B, when the space between adjacent CNTs 100 is relatively wide, the dielectric layer 200 wraps around each CNT 100, respectively. In other embodiments, as shown in FIG. 16C, when the space between adjacent CNTs 100 is relatively narrow, the dielectric layer 200 wrapping around one CNT 100 is continuous to the dielectric layer 200 wrapping around adjacent CNT 100.

Next, as shown in FIGS. 17A and 17B, part of the dielectric layer 200 is removed from the source/drain regions of the CNTs 100, and thus a part of the source/drain region of CNT 100 is exposed. In some embodiments, a portion of the dielectric layer is removed from the top of the CNTs 100 as shown in FIG. 17B. In some embodiments, anisotropic dry etching is used. In other embodiments, anisotropic etching and isotropic etching are alternately performed.

Next, as shown in FIGS. 18A and 18B, the source/drain contact openings 65 are filled with one or more layers of a conductive material. The conductive material includes one or more of W, Cu, Ti, Ag, Al, TiAl, TiAlN, TaC, TaCN, TaSiN, Mn, Co, Pd, Ni, Re, Ir, Ru, Pt, and Zr, or any other suitable conductive materials. In some embodiments, a lower contact layer 70 wraps around the source/drain regions of CNTs 100 with interposing dielectric layer 200, and an upper contact layer 72 is formed on the lower contact layer 70.

In some embodiments, the lower contact layer 70 is one or more of TiN, Ti and TaN. The upper contact layer is one or more of W, Cu and Co in some embodiments. Further, in some embodiments, one or more gate contacts are formed at the same time as the source/drain contacts or by different operations from the source/drain contacts.

FIGS. 19A-19C and 19D-19F illustrate various stages of a sequential fabrication process of a GAA FET using a CNT in accordance with embodiments of the present disclosure. As shown in FIG. 19A, the dielectric layer 200 includes the first dielectric layer 210 and the second dielectric layer 220 (or the third dielectric layer 230 and the fourth dielectric layer 240).

In some embodiments, when the space between adjacent CNTs 100 is relatively wide, the dielectric layer 200 wraps around each CNT 100, respectively. In other embodiments, as shown in FIGS. 19A-19C, when the space between adjacent CNTs 100 is relatively narrow, the first dielectric layer 210 wraps around each CNT 100, respectively, and the second dielectric layer 220 wrapping around one CNT 100 is continuous to the second dielectric layer 220 wrapping around adjacent CNTs 100. In other embodiments, as shown inFIGS. 19D-19F, when the space between adjacent CNTs 100 is narrower, the first dielectric layer 210 wrapping around each CNT 100 and the second dielectric layer 220 wrapping around one CNT 100 are continuous to the first and second dielectric layers wrapping around adjacent CNTs 100.

Figure 19I:
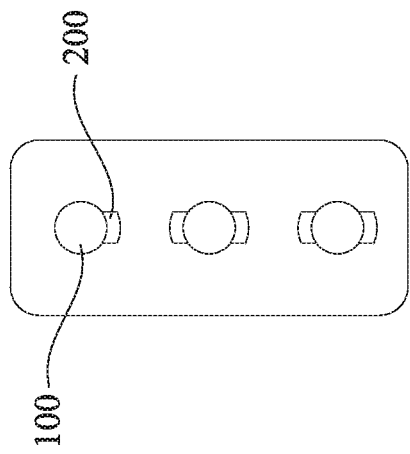
FIGS. 19G, 19H and 19I illustrate various stages of a sequential fabrication process of a GAA FET using a CNT in accordance with an embodiment of the present disclosure.
Figure 19H:
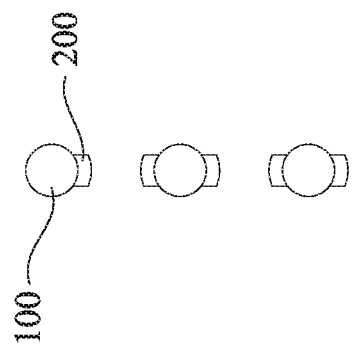
Figure 19G:
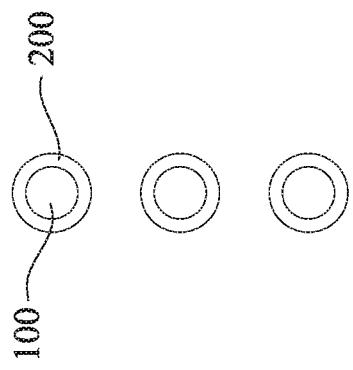

FIGS. 19G, 19H and 19I illustrate various stages of a sequential fabrication process of a GAA FET using a CNT in accordance with an embodiment of the present disclosure. Along the vertical direction (Z direction), the dielectric layer 200 (or bi-layer) wraps around each of the CNTs 100 as shown in FIG. 19G. In the etching operation to remove a part of the dielectric layer, the top and side of the topmost CNT 100 are exposed and sides of the CNTs 100 below the topmost one are exposed. Thus, the coverage of the dielectric layer 200 is different between the topmost CNT 100 and the other CNTs there below.

The total number of the CNTs 100 in one GAA FET is in a range from about 5 to about 100 in some embodiments, and is in a range from about 10 about 50 in other embodiments. The total number of CNTs in one GAA FET is different from a total number of CNTs in another GAA FET, in some embodiments. In some embodiments, in a GAA FET, two CNTs among the CNTs contact each other in a horizontal direction, and no CNT contacts another CNT in a vertical direction. In some embodiments, the source/drain contacts are first formed and then the gate structure is formed.

Figures 20A, 20B:
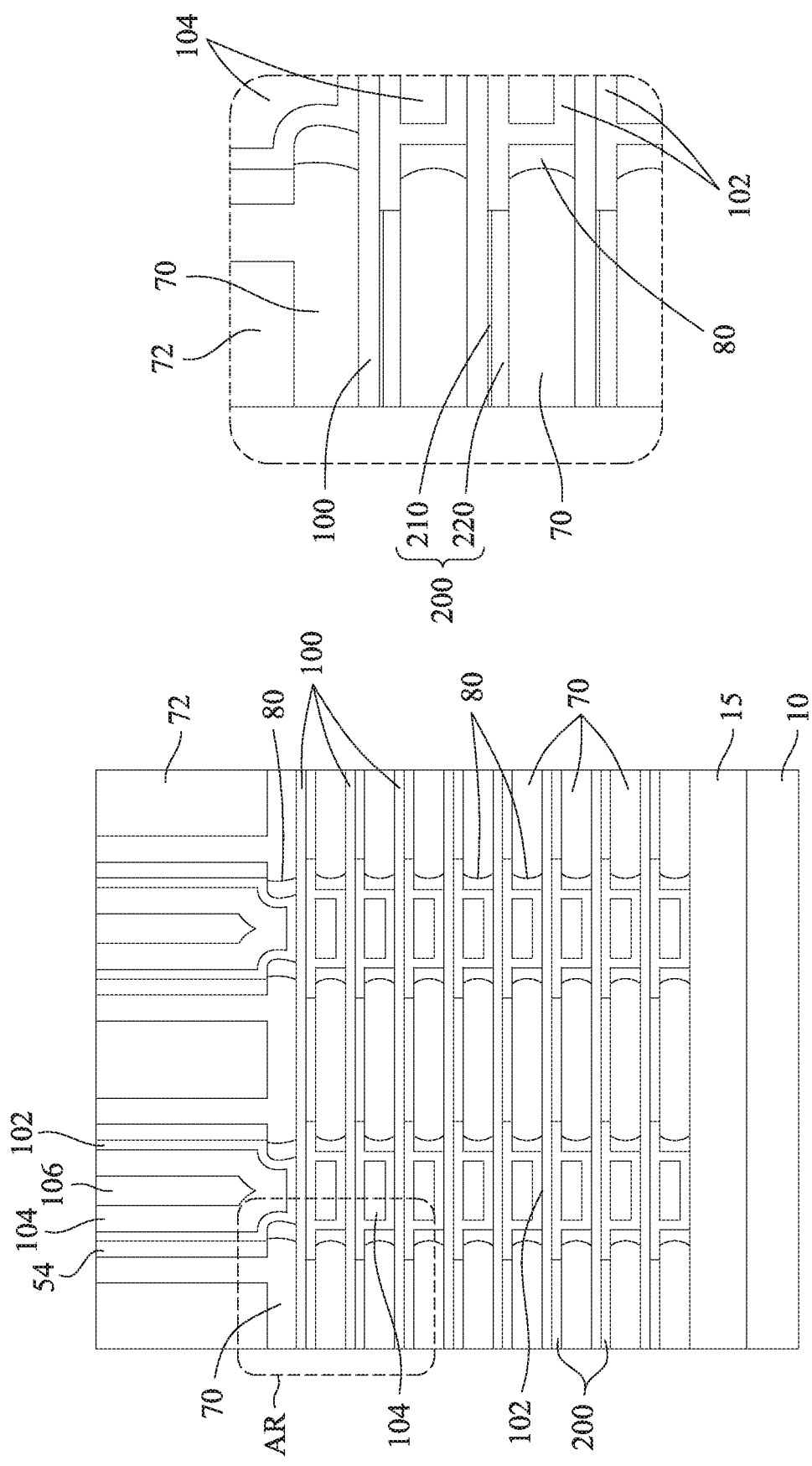
FIGS. 20A and 20B illustrate cross sectional views of a GAA FET using a CNT in accordance with an embodiment of the present disclosure.

FIGS. 20A and 20B illustrate cross sectional views of a GAA FET using a CNT in accordance with another embodiment of the present disclosure. Materials, configurations, dimensions, processes and/or operations same as or similar to those described with respect to FIGS. 1A-19I may be employed in the following embodiments and the detailed explanation may be omitted. FIG. 20B is an enlarged view of the enclosed area AR of FIG. 20A.

In this embodiment, the dielectric layer 200 (including the first dielectric layer 210 and the second dielectric layer 220, in some embodiments) is disposed below the source/drain region of the CNTs 100, and is in contact with the gate dielectric layer 102. Further, the gate electrode (e.g., the work function adjustment layer 104) is electrically isolated from the source/drain contact 70 by the dielectric layer 102 and insulating inner spacers 80. In some embodiments, the insulating inner spacer is disposed between the CNT 100 and the gate dielectric layer 102. In some embodiments, the gate dielectric layer 102 is disposed between the insulating inner spacer and the CNT 100. In some embodiments, the gate dielectric layer 102 is disposed between the source/drain contact 70 and the CNT 100. In some embodiments, instead of or in addition to the gate sidewall spacers 44, contact spacers 54 are famed between the gate dielectric layer 102 and the source/drain contact 70 at the height of above the channel regions.

Subsequently, further CMOS processes are performed to form various features such as additional interlayer dielectric layers, contacts/vias, interconnect metal layers, and passivation layers, etc.

FIGS. 21A-31 illustrate various stages of fabrication operations of a GAA FET using carbon nanotubes shown in FIGS. 20A and 20B in accordance with an embodiment of the present disclosure. It is understood that additional operations can be provided before, during, and after processes shown by FIGS. 21A-31, and some of the operations described below can be replaced or eliminated, for additional embodiments of the method. The order of the operations/processes may be interchangeable. Materials, configurations, dimensions, processes and/or operations same as or similar to those described with respect to FIGS. 1A-19I may be employed in the following embodiments and the detailed explanation may be omitted.

Figure 21A:
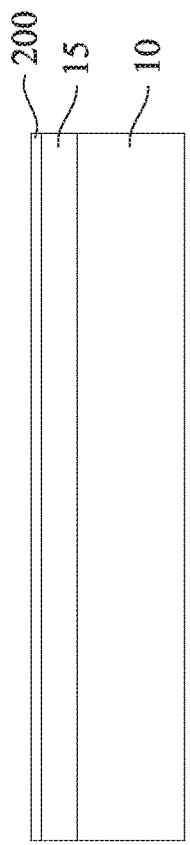
FIGS. 21A, 21B, 21C and 21D illustrate various stages of a sequential fabrication process of a GAA FET using a CNT in accordance with an embodiment of the present disclosure.
Figure 21B:
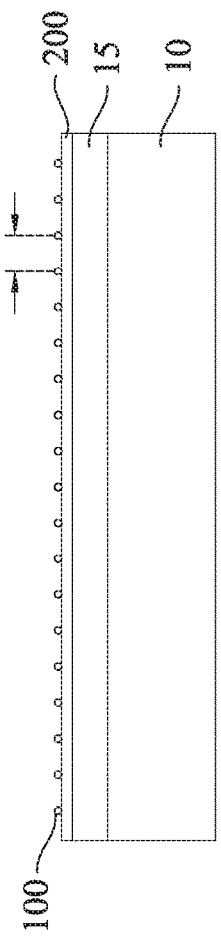
Figure 21C:
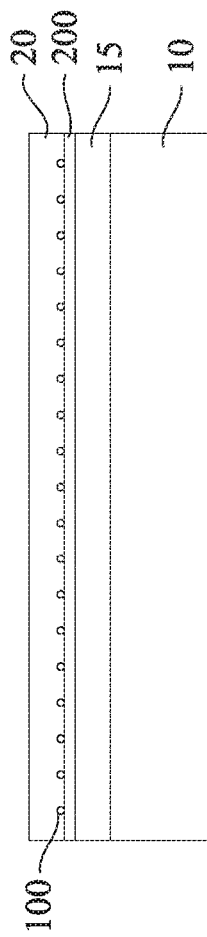
Figure 21D:
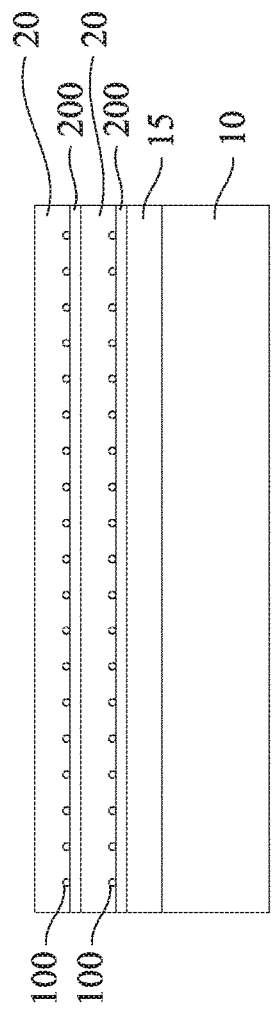

Similar to FIG. 6A, a bottom support layer 15 is formed over a substrate 10, and then, a dielectric layer 200 is formed over the bottom support layer 15, as shown in FIG. 21A. In some embodiments, the dielectric layer 200 is a single layer or a bi-layer of first and second dielectric layer 210 and 220 or third and fourth dielectric layer 230 and 240. Then, similar to FIG. 6B, one or more carbon nanotubes (CNTs) 100 are arranged over the dielectric layer 200. Further, similar to FIG. 6C, a support layer 20 is formed over the CNTs 100 as shown in FIG. 21C. The formation of a dielectric layer 200, disposition of CNTs 100 and the formation of a support layer 20 are repeated as shown in FIG. 21D. In some embodiments, a support layer 20 is formed on the bottom support layer 15 and the dielectric layer 200 is formed on the support layer 20.

FIGS. 22A, 22B and 22C illustrate one of the various stages of a sequential fabrication process of a GAA FET using a CNT in accordance with an embodiment of the present disclosure.

In some embodiments, the stacked structure 29 including the support layer 20, the dielectric layer 200 and the CNTs 100 are repeatedly formed over the bottom support layer 15 (and the substrate 100). The number of the stacked structures 29 is as small as one, or two, three or more. In some embodiments, the number of the stacked structures 29 is up to 20.

Figure 23:
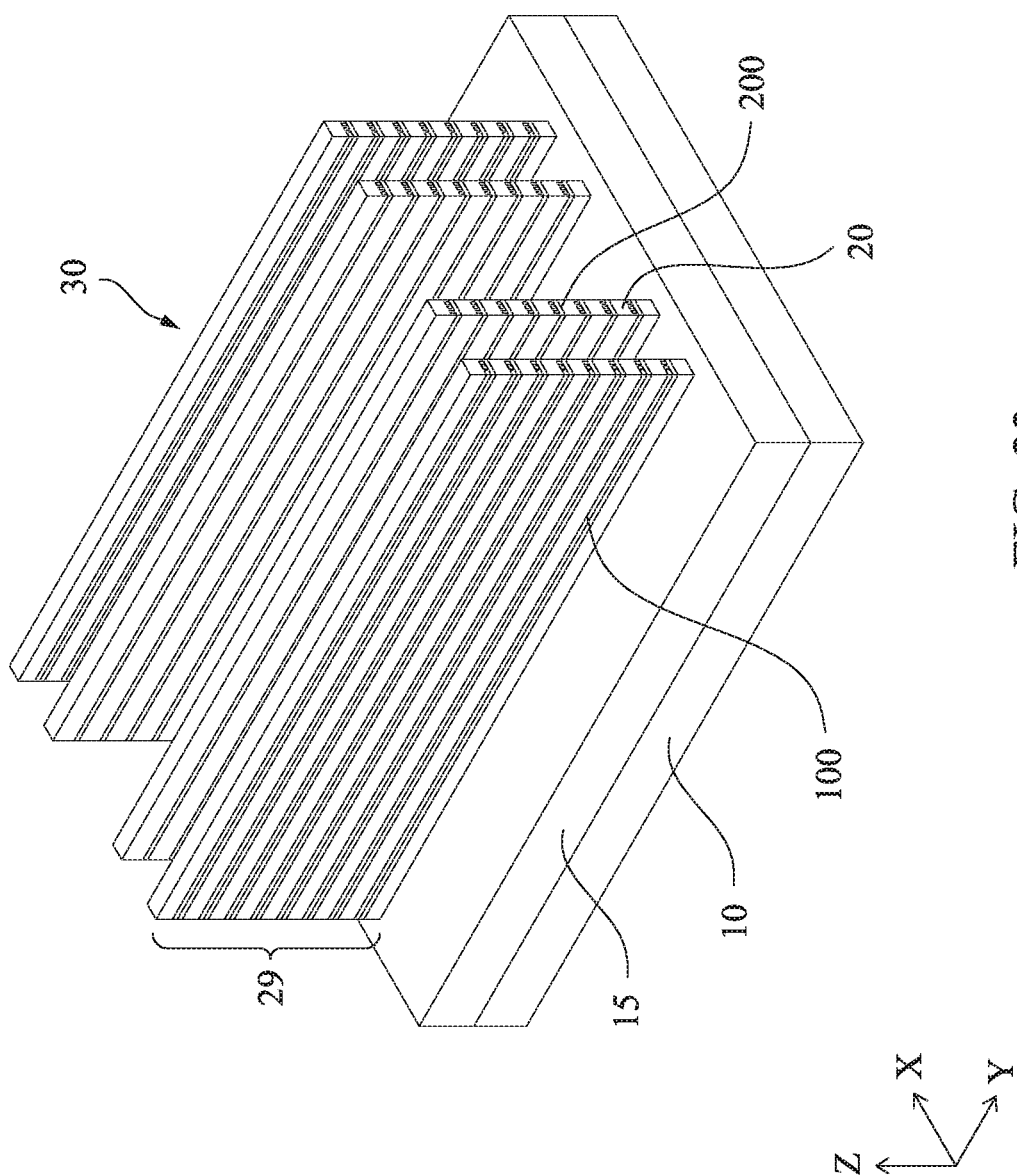
FIG. 23 illustrates one of the various stages of a sequential fabrication process of a GAA FET using a CNT in accordance with an embodiment of the present disclosure.

FIG. 23 illustrates one of the various stages of a sequential fabrication process of a GAA FET using a CNT in accordance with an embodiment of the present disclosure. Similar to FIG. 6F, by using one or more lithography and etching operations, a mask pattern is formed over the topmost support layer 20, and the stacked structures 29 are patterned into one or more fin structures 30 as shown in FIG. 23.

FIGS. 24A and 24B illustrate one of the various stages of a sequential fabrication process of a GAA FET using a CNT in accordance with an embodiment of the present disclosure. Similar to FIGS. 8A and 8B, a sacrificial gate structure 40 with the hard mask pattern 42 is formed over the fin structures 30 as shown in FIGS. 24A and 24B. Further, a first ILD layer 50 is formed between the sacrificial gate structures 40 with the hard mask pattern 42. After a thick ILD layer is formed, a CMP operation is performed to expose the hard mask pattern 42 in some embodiments. In some embodiments, before the sacrificial gate structure (e.g., polysilicon layer) is formed, a sacrificial gate dielectric layer 41 is formed by, for example, ALD or CVD, over the fin structures 30 and the bottom support layer 15.

Figure 25B:
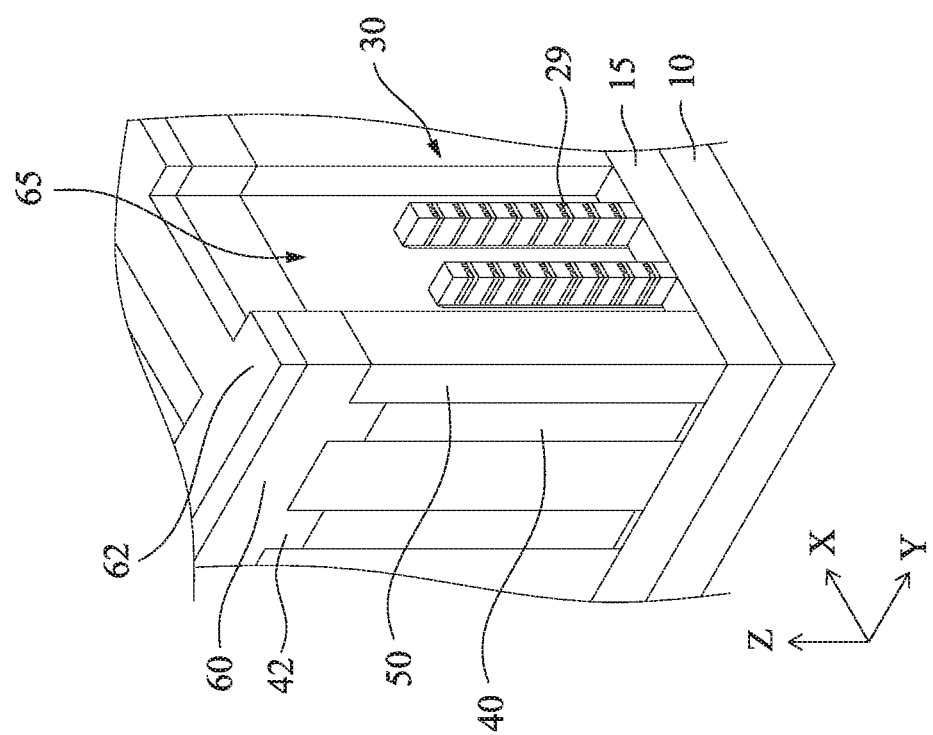
FIGS. 25A and 25B illustrate one of the various stages of a sequential fabrication process of a GAA FET using a CNT in accordance with an embodiment of the present disclosure.
Figure 25A:
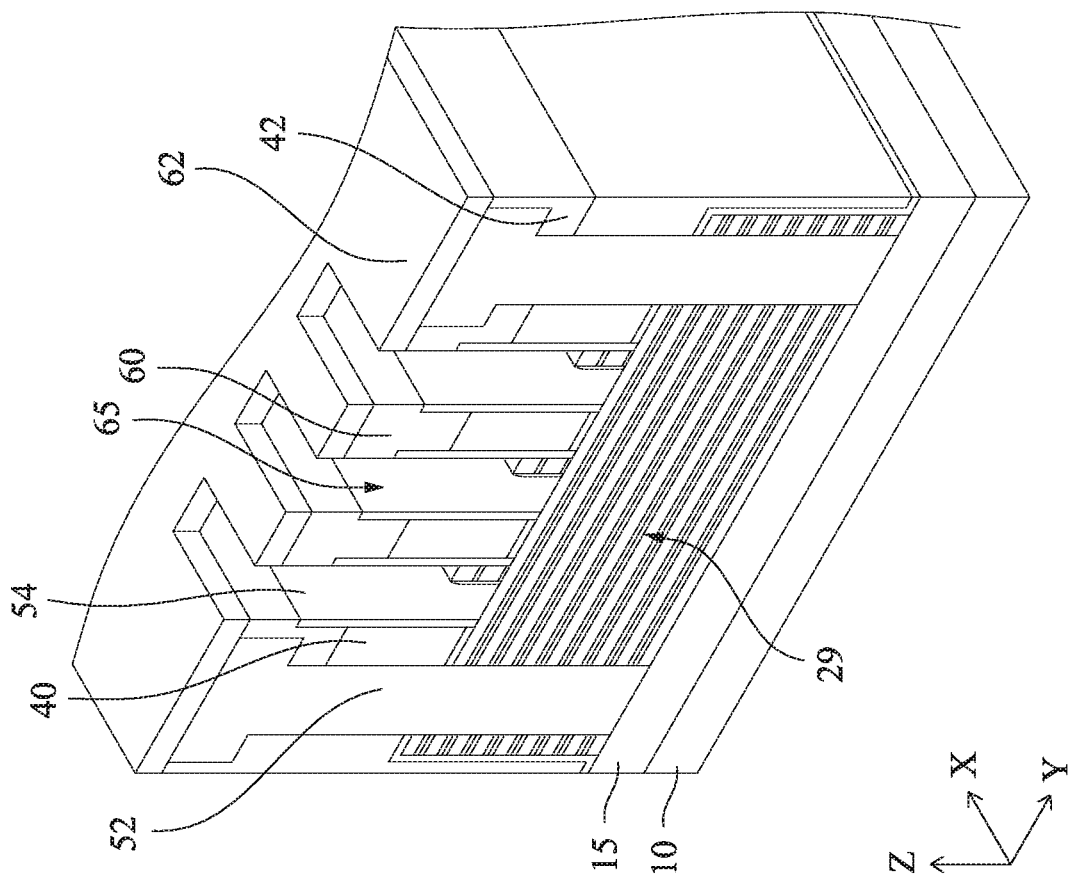

FIGS. 25A and 25B illustrate one of the various stages of a sequential fabrication process of a GAA FET using a CNT in accordance with an embodiment of the present disclosure. A second ILD layer 60 is formed over the first ILD layer 50 and the hard mask pattern 42. The material of the second ILD layer 60 is the same as the first ILD layer 50 in some embodiments, and different from that of the first ILD layer 50 in other embodiments. In some embodiments, the second ILD layer 60 is made of silicon nitride and/or SiON.

In some embodiments, isolation structures 52 are formed as shown in FIGS. 25A and 25B. In some embodiments, the first ILD layer 50 and the stacked structures 29 are patterned by one or more lithography and etching operations to form openings, and then the openings are filled with one or more insulating materials. Further, a hard mask layer 62 is formed and patterned, and then source/drain contact openings 65 are formed by etching the second ILD layer 60 and the first ILD layer 50, as shown in FIGS. 25A and 25B. In the source/drain contact openings 65, the stacked structures 29 of the fin structure 30 are exposed, as shown in FIG. 25B. In some embodiments, part of the first ILD layer remains as contact sidewalls 54 along the sacrificial gate structure 40.

FIGS. 26A and 26B illustrate one of the various stages of a sequential fabrication process of a GAA FET using a CNT in accordance with an embodiment of the present disclosure. After the source/drain contact openings 65 are formed, the support layer 20 is selectively removed from the exposed stacked structures 29 as shown in FIGS. 25A and 25B. In some embodiments, dry etching and/or wet etching are performed to remove the support layer 20. Thus, as shown in FIGS. 26A and 26B, the stacks of the dielectric layer 200 and the CNTs 100 remain in the source/drain contact openings 65.

Figure 27A:
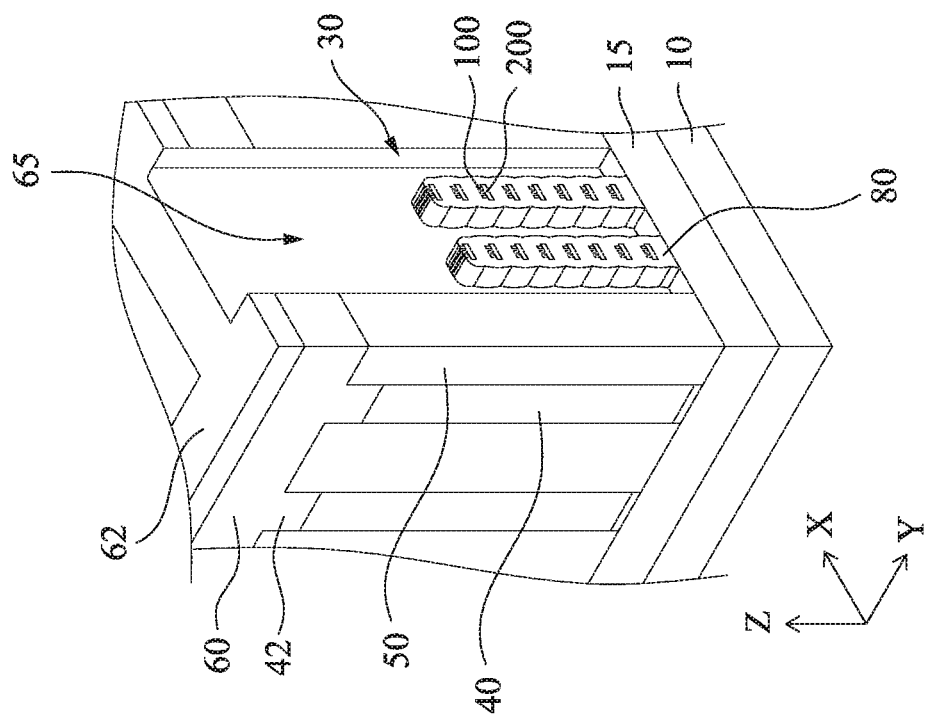
FIGS. 27A and 27B illustrate one of the various stages of a sequential fabrication process of a GAA FET using a CNT in accordance with an embodiment of the present disclosure.
Figure 27B:
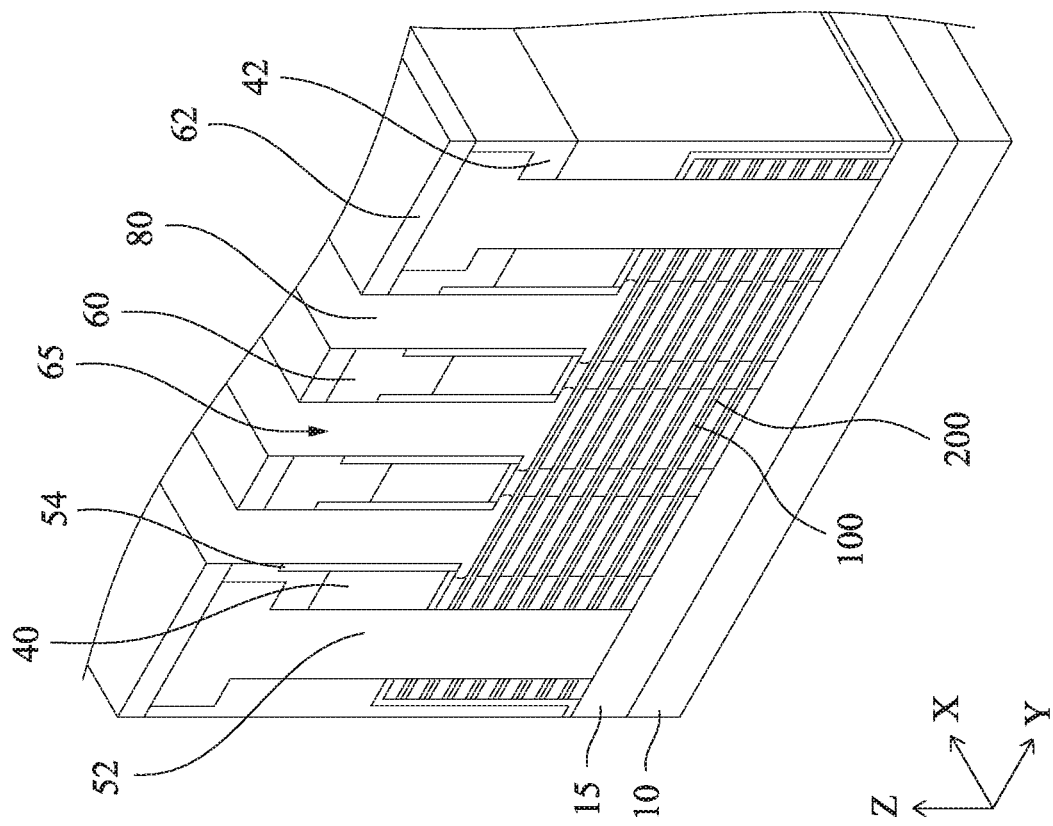

FIGS. 27A and 27B illustrate one of the various stages of a sequential fabrication process of a GAA FET using a CNT in accordance with an embodiment of the present disclosure.

After the support layer 20 is removed in the source/drain contact openings 65, an insulating layer 80 for insulating inner spacers is formed inside of the source/drain contact openings 65. As shown in FIG. 27B, the insulating layer 80 is conformally formed by, for example, ALD or CVD. In some embodiments, the insulating layer is made of silicon oxide, silicon nitride, SiON, SiCN, SiOC, SiOCN or any other suitable material.

Figure 28B:
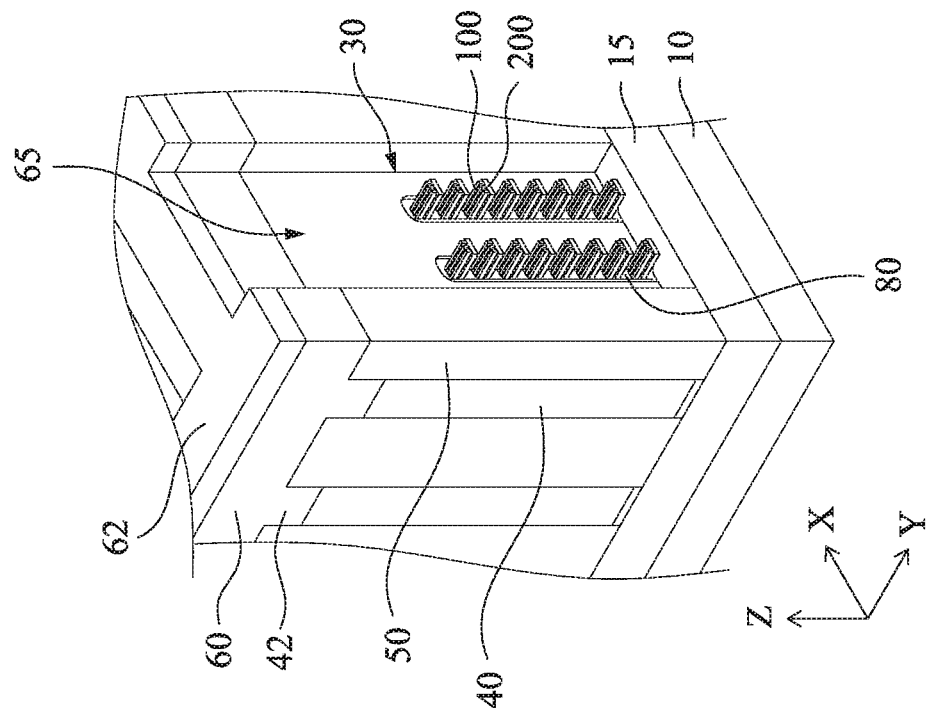
FIGS. 28A and 28B illustrate one of the various stages of a sequential fabrication process of a GAA FET using a CNT in accordance with an embodiment of the present disclosure.
Figure 28A:
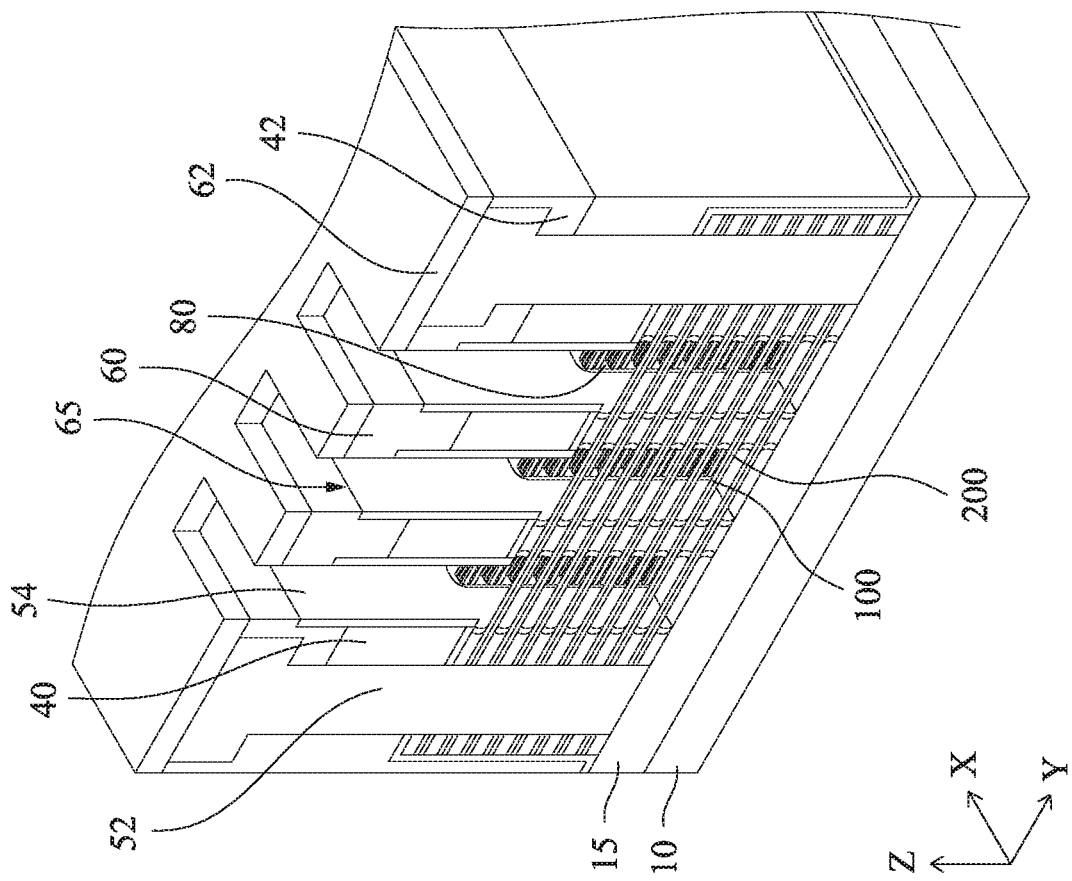

FIGS. 28A and 28B illustrate one of the various stages of a sequential fabrication process of a GAA FET using a CNT in accordance with an embodiment of the present disclosure. The insulating layer is then etched to form the insulating inner spacers 80 on ends of the support layers 20 under the sacrificial gate structures 40, as shown in FIGS. 28A and 28B. Thus, the stacks of the dielectric layer 200 and the CNTs 100 are again exposed in the source/drain contact openings 65.

Figure 29A:
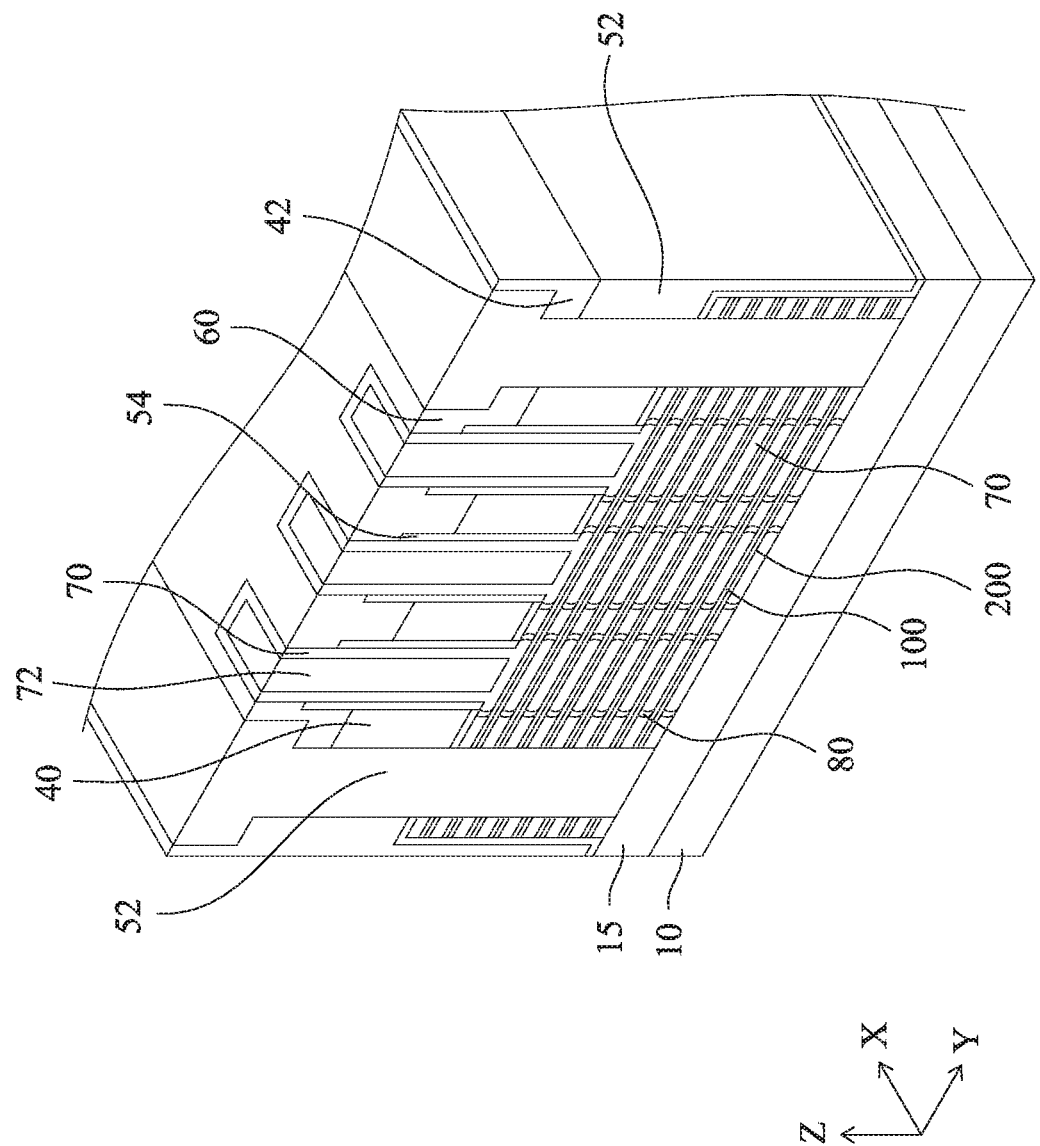
FIGS. 29A, 29B and 29C illustrate one of the various stages of a sequential fabrication process of a GAA FET using a CNT in accordance with an embodiment of the present disclosure.
Figure 29C:
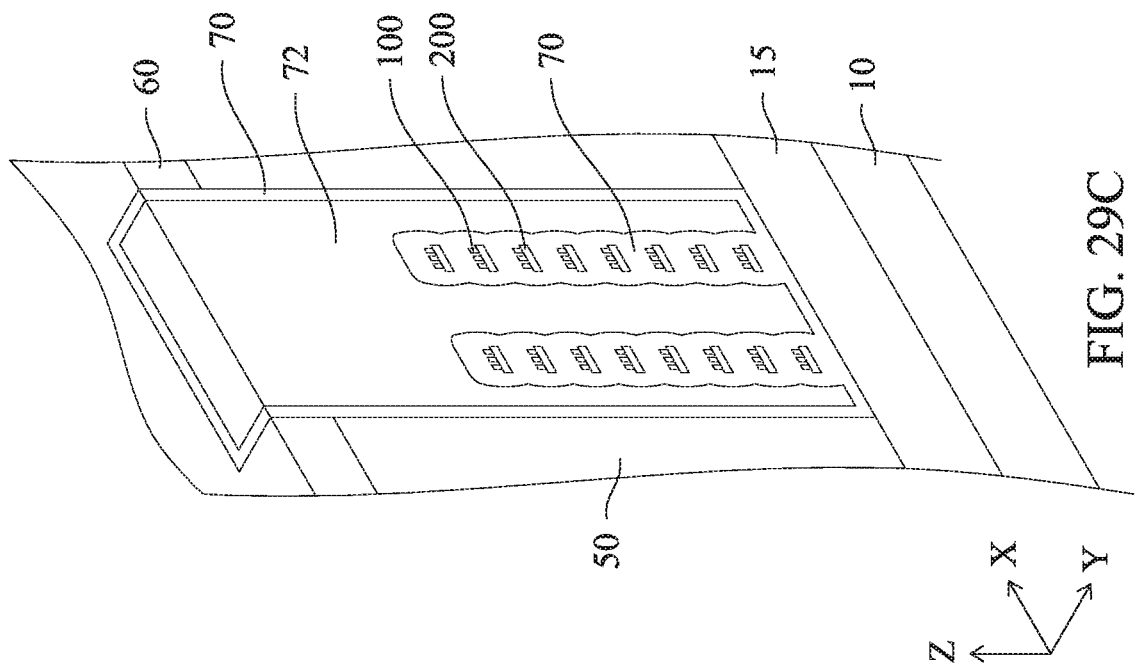
Figure 29B:
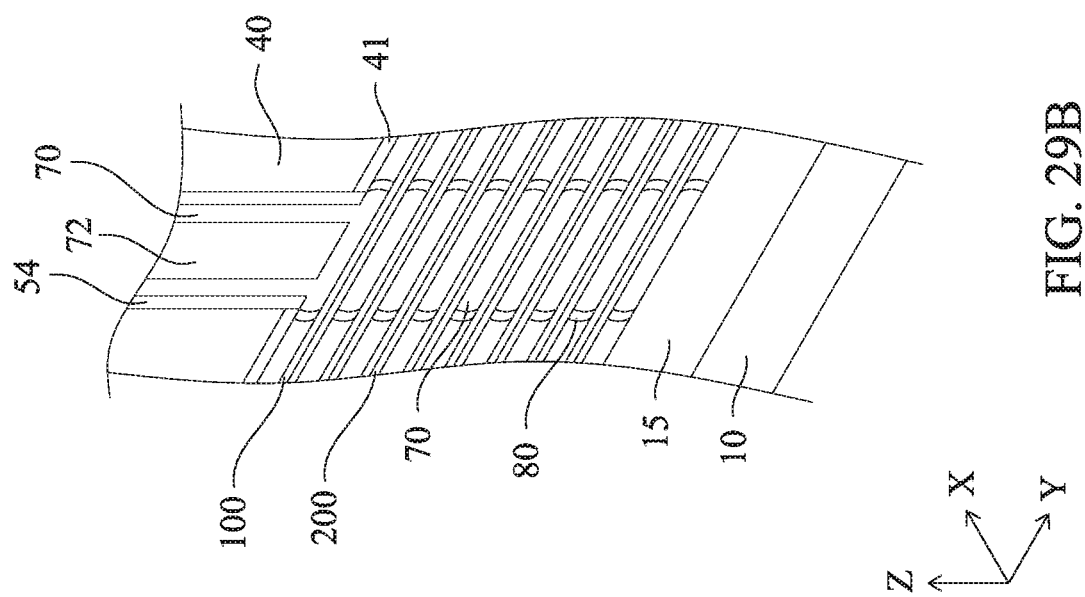

FIGS. 29A-29C illustrate one of the various stages of a sequential fabrication process of a GAA FET using a CNT in accordance with an embodiment of the present disclosure. Similar to FIGS. 18A and 18B, the source/drain contact openings 65 are filled with one or more layers of a conductive material to form a lower contact layer 70 and an upper contact layer 72, as shown in FIGS. 29A-29C. In some embodiments, the lower contact layer 70 and the upper contact layer are collectively referred to as a source/drain contact layer 70, As shown in FIG. 29C, the lower contact layer 70 is in contact with the CNTs 100 and bottoms of the CNTs 100 are covered by the dielectric layer 40 and thus separated from the contact layer 70.

Figure 30B:
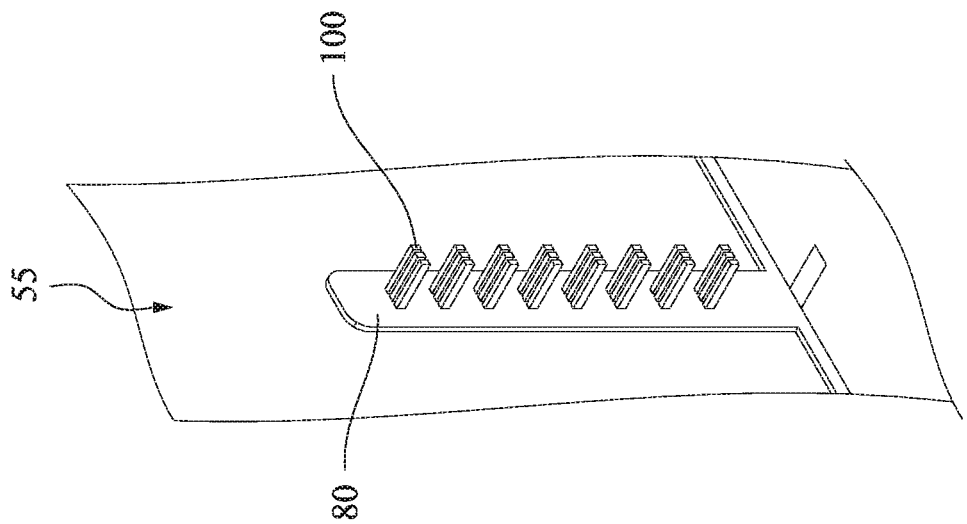
FIGS. 30A and 30B illustrate one of the various stages of a sequential fabrication process of a GAA FET using a CNT in accordance with an embodiment of the present disclosure.
Figure 30A:
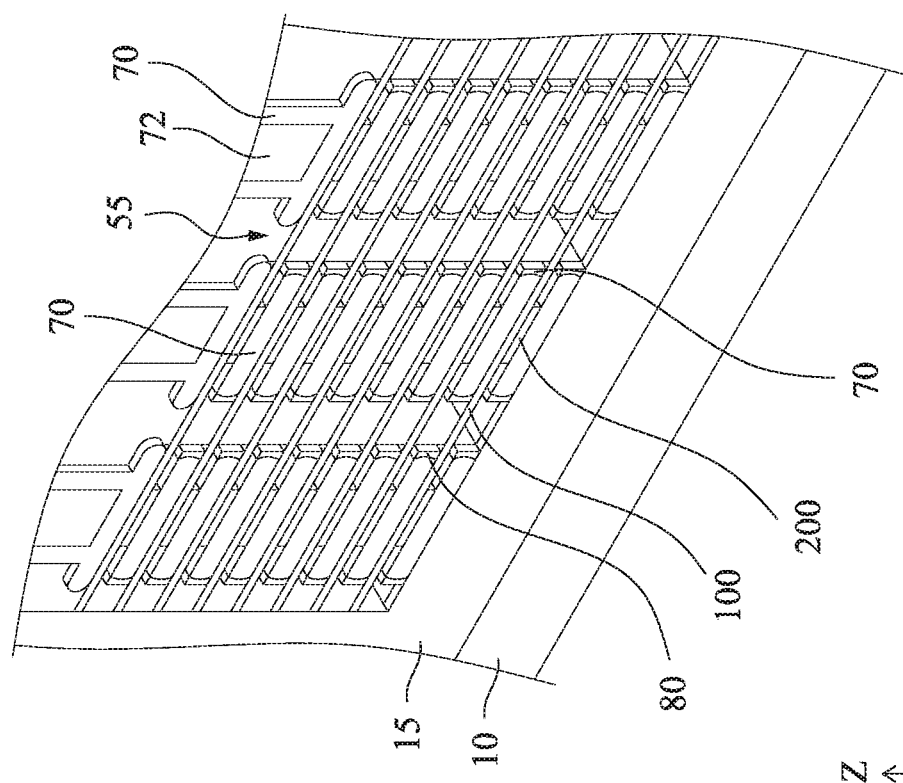

FIGS. 30A and 30B illustrate one of the various stages of a sequential fabrication process of a GAA FET using a CNT in accordance with an embodiment of the present disclosure.

Subsequently, similar to FIGS. 11A-12B, the hard mask pattern 42 and the sacrificial gate structure 40 are removed to form gate spaces 55, and in the gate spaces, the support layer 20 and the dielectric layer 200 are removed, and the CNTs 100 are fully exposed as shown in FIGS. 30A and 30B. In some embodiments, part of the dielectric layer 200 under the inner spacers 80 is also removed. In some embodiments, part of the dielectric layer 200 between the source/drain contact layer 70 is further removed.

Figure 31:
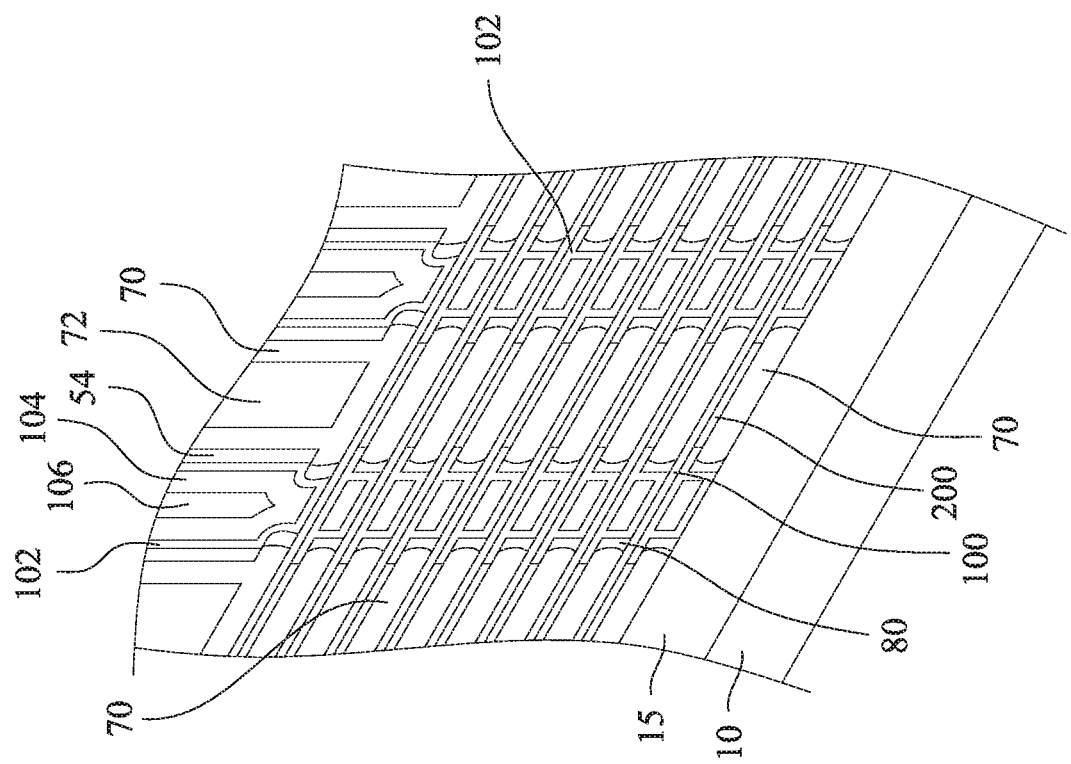
FIG. 31 illustrates one of the various stage of a sequential fabrication process of a GAA FET using a CNT in accordance with an embodiment of the present disclosure.

FIG. 31 illustrates one of the various stages of a sequential fabrication process of a GAA FET using a CNT in accordance with an embodiment of the present disclosure. Similar to FIGS. 13A-14B, after the channel regions of the CNTs 100 are released, a gate dielectric layer 102 is formed around the CNTs 100, one or more work function adjustment layers 104 are formed on the gate dielectric layer 102, and a gate electrode layer 106 is formed over the work function adjustment layer 104, as shown in FIG. 31. Subsequently, further CMOS processes are performed to form various features such as additional interlayer dielectric layers, contacts/vias, interconnect metal layers, and passivation layers, etc.

FIGS. 32A-35C illustrate various stages of a sequential fabrication process of a GAA FET using a CNT in accordance with other embodiments of the present disclosure. The following embodiments show various structure and operations for the stacked structure 29 shown in FIGS. 22A-22C. In FIGS. 32A-32D, a bottom dielectric layer 200A is formed on the support layer 20 (or the bottom support layer 15) and the CNTs 100 are disposed on the bottom dielectric layer 200A. Then, an upper dielectric layer 200B is formed to cover the CNTs 100, as shown in FIG. 32A. As shown in FIG. 32B, a planarization operation, such as an etch-back operation and a CMP operation, is performed, and the upper dielectric layer 200B is partially removed, to expose upper portions of the CNTs 100. The additional support layer 20 is then formed over the upper dielectric layer 200A and the CNTs 100, as shown in FIG. 32C. FIG. 32D shows a structure after the source/drain contact 70 is formed.

In FIGS. 33A-33D, CNTs 100 are disposed on the support layer 20, and then the dielectric layer 200 is formed to cover the CNTs 100 as shown in FIG. 33A. As shown in FIG. 33B, a planarization operation, such as an etch-back operation and a CMP operation, the dielectric layer 200 is partially removed, to expose upper portions of the CNTs 100. The additional support layer 20 is then formed over the dielectric layer 200 and the CNTs 100, as shown in FIG. 33C. FIG. 33D shows a structure after the source/drain contact 70 is formed. Bottoms of the CNTs 100 are in contact with the source/drain contact 70 in some embodiments.

In FIGS. 34A-34D, a bottom dielectric layer 200A is formed on the support layer 20 (or the bottom support layer 15) and the CNTs 100 are disposed on the bottom dielectric layer 200A. Then, an upper dielectric layer 200B is formed to cover the CNTs 100 as shown in FIG. 34A. As shown in FIG. 34B, an etch-back operation is performed to form sidewalls of the dielectric layer on sides of the CNTs 100 and to expose upper portions of the CNTs 100. The additional support layer 20 is then formed over the CNTs 100, as shown in FIG. 34C. FIG. 34D shows a structure after the source/drain contact 70 is formed. In some embodiments, the bottom dielectric layer is not formed similar to FIGS. 33A-33D.

Figure 35A:
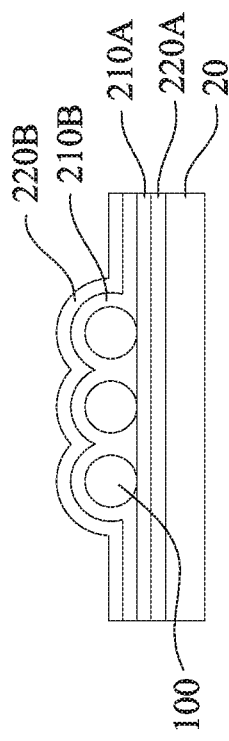
FIGS. 35A, 35B and 35C illustrate various stages of a sequential fabrication process of a GAA FET using a CNT in accordance with an embodiment of the present disclosure.
Figure 35B:
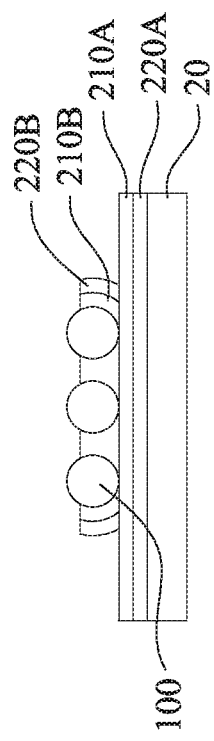
Figure 35C:
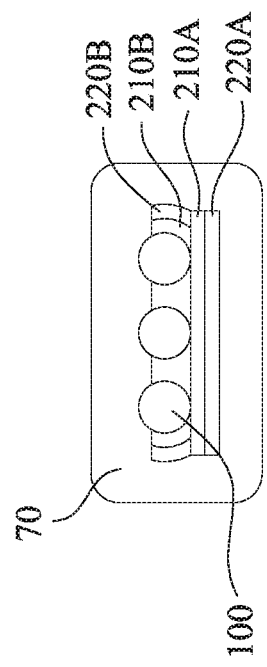

In FIGS. 35A-35C, a bottom second dielectric layer 220A is formed on the support layer 20 (or the bottom support layer 15) and a bottom first dielectric layer 210A is formed on the bottom second dielectric layer 220A. The CNTs 100 are disposed on the bottom second dielectric layer 210A. Then, an upper first dielectric layer 210B is formed to cover the CNTs 100 and an upper second dielectric layer 220B is formed on the upper first dielectric layer 210B, as shown in FIG. 35A. In some embodiments, the upper first and second dielectric layers are conformally formed. As shown in FIG. 35B, a planarization operation, such as an etch-back operation and a CMP operation, is performed, and the upper first and second dielectric layers are partially removed, to expose upper portions of the CNTs 100. The additional support layer 20 is then formed over the upper dielectric layer 200A and the CNTs 100. FIG. 35C shows a structure after the source/drain contact 70 is formed. In some embodiments, the bottom first and/or second dielectric layers are not formed similar to FIGS. 33A-33D.

Figure 36A:
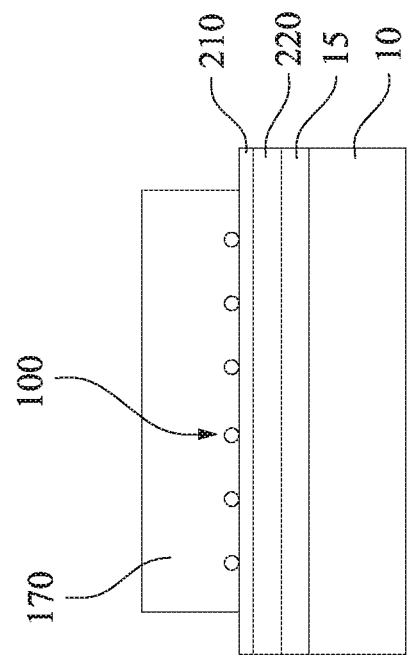
FIGS. 36A and 36B show a planar FET using a CNT in accordance with an embodiment of the present disclosure.
Figure 36B:
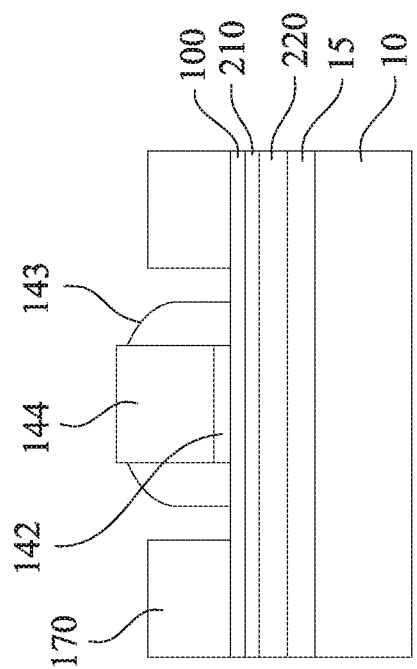

FIGS. 36A and 36B show cross sectional views of a planar FET using a CNT in accordance with an embodiment of the present disclosure. Materials, configurations, dimensions, processes and/or operations same as or similar to those described with respect to FIGS. 1A-35C may be employed in the following embodiments and the detailed explanation may be omitted. FIG. 36A shows a cross sectional view along the source-to-drain (Y) direction and FIG. 36B is a cross sectional view along the gate extending direction (X).

As shown in FIGS. 36A and 36B, a bottom support layer (or an isolation layer) 15 is formed over a substrate 10. In some embodiments, a second dielectric layer 220 is formed over the bottom support layer 15 and a first dielectric layer 210 is formed on the second dielectric layer 220. Further, CNTs 100 are disposed on the first dielectric layer 210. In some embodiments, a single-layer dielectric layer or three-layer dielectric layer is used. A gate dielectric layer is disposed over a channel region of the CNTs 100 and a gate electrode layer 144 is disposed over the gate dielectric layer 142. Gate sidewall spacers 143 are disposed on opposing side faces of the gate electrode layer 144. Source/drain electrodes 170 are disposed on source/drain regions of the CNTs 100. Similar to the GAA FET as set forth above, the source/drain electrode 170 partially covers the CNTs 100 and the dielectric layer (e.g., dielectric dipole layers 210 and 220) covers the remaining part of the CNTs 100 in the source/drain regions.

It will be understood that not all advantages have been necessarily discussed herein, no particular advantage is required for all embodiments or examples, and other embodiments or examples may offer different advantages. For example, in the present disclosure, because stacked structures of CNTs are formed as fin structures, it is possible to increase CNT density within one GAA FET. Further, by utilizing the embedded doping structure in the source/drain regions of the CNT, it is possible to increase movable carriers in the source/drain regions and to reduce contact resistance in the source/drain regions.

In accordance with an aspect of the present disclosure, in a method of forming a gate-all-around field effect transistor (GAA FET), a fin structure is formed. The fin structure includes a plurality of stacked structures each comprising a dielectric layer, a CNT over the dielectric layer, a support layer over the CNT. A sacrificial gate structure is formed over the fin structure, an isolation insulating layer is formed, a source/drain opening is formed by patterning the isolation insulating layer, the support layer is removed from each of the plurality of stacked structures in the source/drain opening, and a source/drain contact layer is formed in the source/drain opening. The source/drain contact is formed such that the source/drain contact is in direct contact with only a part of the CNT and a part of the dielectric layer is disposed between the source/drain contact and the CNT. In one or more of the foregoing and following embodiments, the part of the dielectric layer includes fixed positive charges inside, inducing negative charges in the CNT. In one or more of the foregoing and following embodiments, the dielectric layer is made of non-stoichiometric silicon nitride. In one or more of the foregoing and following embodiments, the dielectric layer includes a first dielectric layer in contact with the CNT and a second dielectric layer formed on the first dielectric layer, and in the part of the dielectric layer, the first dielectric layer and the second dielectric layer constitute a dielectric dipole structure inducing negative charges in the CNT. In one or more of the foregoing and following embodiments, the first dielectric layer is made of aluminum oxide and the second dielectric layer is made of hafnium oxide. In one or more of the foregoing and following embodiments, the dielectric layer includes a first dielectric layer in contact with the CNT, a second dielectric layer disposed over the first dielectric layer and a third dielectric layer disposed over the second dielectric layer, and in the part of the dielectric layer, the first to third dielectric layers constitute a dielectric dipole structure inducing positive charges in the CNT. In one or more of the foregoing and following embodiments, the first dielectric layer is made of aluminum oxide, and the second dielectric layer is made of silicon oxide and the third dielectric layer is made of aluminum oxide. In one or more of the foregoing and following embodiments, in a cross section, the part of the dielectric layer covers 25% to 90% of an outer circumference of the CNT. In one or more of the foregoing and following embodiments, after the source/drain contact is formed, a gate space is formed by removing the sacrificial gate structure, the dielectric layer and the support layer are removed in the gate space such that the CNT is exposed in the gate space, and a gate dielectric layer is formed around the CNT and a gate electrode is formed over the gate dielectric layer. In one or more of the foregoing and following embodiments, after the support layer is removed and before the source/drain contact is formed, an insulating inner spacer is formed at an end of the support layer under the sacrificial gate structure. In one or more of the foregoing and following embodiments, when the dielectric layer and the support layer are removed in the gate space, a part of the dielectric layer disposed between the insulating inner spacer and the CNT is removed. In one or more of the foregoing and following embodiments, when the dielectric layer and the support layer are removed in the gate space a part of the dielectric layer disposed between the source/drain contact and the CNT is removed. In one or more of the foregoing and following embodiments, a plurality of CNTs are included in each of the plurality of stacked structures. In one or more of the foregoing and following embodiments, the support layer is made of a polycrystalline or amorphous material of one of Si, Ge and SiGe. In one or more of the foregoing and following embodiments, the support layer is made of a dielectric material different from the dielectric layer.

In accordance with another aspect of the present disclosure, in a method of forming a gate-all-around field effect transistor (GAA FET), a fin structure, in which carbon nanotubes (CNTs) are embedded in a support material, is formed over a substrate, a sacrificial gate structure is formed over the fin structure, an insulating layer is formed over the sacrificial gate structure and the fin structure, the sacrificial gate structure is removed so that a part of the fin structure is exposed, the support material is removed from the exposed part of the fin structure so that channel regions of CNTs are exposed, a gate structure is formed around the exposed channel regions of CNTs, a source/drain opening is formed in the insulating layer, the support material is removed in the source/drain opening so that source/drain regions of the CNTs are exposed, a dielectric layer is formed around the exposed CNTs in the source/drain opening, the dielectric layer is partially removed so that a part of the dielectric layer remains on the CNTs in the source/drain opening, and a source/drain contact layer is formed in the source/drain opening. The source/drain contact is formed such that the source/drain contact is in direct contact with part of the CNTs and the remaining part of the dielectric layer is disposed between the source/drain contact and the CNTs. In one or more of the foregoing and following embodiments, the part of the dielectric layer is a single dielectric layer having fixed positive charges inside. In one or more of the foregoing and following embodiments, the dielectric layer includes a first dielectric layer in contact with the CNT and a second dielectric layer formed on the first dielectric layer, and in the remaining part of the dielectric layer, the first dielectric layer and the second dielectric layer constitute a dielectric dipole structure. In one or more of the foregoing and following embodiments, in a cross section, the remaining part of the dielectric layer covers 25% to 90% of an outer circumference of each of the CNTs.

In accordance with another aspect of the present disclosure, in a method of forming a gate-all-around field effect transistor (GAA FET), a fin structure, in which carbon nanotubes (CNTs) are embedded in a support material, is formed over a substrate, an isolation insulating layer is formed, a gate structure is formed by using a gate replacement technology around channel regions of the CNTs, and a source/drain contact is formed in contact with source/drain regions of the CNTs. The source/drain contact is formed such that the source/drain contact is in direct contact with only a part of each of the CNT and a dielectric layer partially covers each of the CNTs and is disposed between the source/drain contact and each of the CNTs.

In accordance with one aspect of the present disclosure, a semiconductor device having a gate-all-around field effect transistor, includes a carbon nanotube (CNT) disposed over a substrate, a gate structure formed around the CNT in a channel region, and a source/drain contact formed around the CNT in a source/drain region. The source/drain contact is in direct contact with only a part of the CNT and a dielectric layer partially covers the CNT and is disposed between the source/drain contact and the CNT. In one or more of the foregoing and following embodiments, the dielectric layer includes fixed positive charges inside, inducing negative charges in the CNT. In one or more of the foregoing and following embodiments, the dielectric layer is made of non-stoichiometric silicon nitride. In one or more of the foregoing and following embodiments, the dielectric layer includes a first dielectric layer in contact with the CNT and a second dielectric layer formed on the first dielectric layer, and the first dielectric layer and the second dielectric layer constitute a dielectric dipole structure inducing negative charges in the CNT. In one or more of the foregoing and following embodiments, the first dielectric layer is made of aluminum oxide and the second dielectric layer is made of hafnium oxide. In one or more of the foregoing and following embodiments, the dielectric layer includes a first dielectric layer in contact with the CNT, a second dielectric layer disposed over the first dielectric layer and a third dielectric layer disposed over the second dielectric layer, and the first to third dielectric layers constitute a dielectric dipole structure inducing positive charges in the CNT. In one or more of the foregoing and following embodiments, the first dielectric layer is made of aluminum oxide, and the second dielectric layer is made of silicon oxide and the third dielectric layer is made of aluminum oxide. In one or more of the foregoing and following embodiments, in a cross section, the dielectric layer covers 25% to 90% of an outer circumference of the CNT. In one or more of the foregoing and following embodiments, the semiconductor device further includes an insulating inner spacer disposed between the gate structure and the source/drain contact. In one or more of the foregoing and following embodiments, the insulating inner spacer is disposed between the CNT and a gate dielectric layer of the gate structure. In one or more of the foregoing and following embodiments, the gate dielectric layer is disposed between the CNT and the source/drain contact. In one or more of the foregoing and following embodiments, the dielectric layer is disposed at a bottom of the CNT and a top of the CNT is covered by the source/drain contact.

In accordance with another aspect of the present disclosure, a semiconductor device having a gate-all-around field effect transistor includes carbon nanotubes (CNTs) disposed over a substrate, a gate structure formed around the CNTs in a channel region, and a source/drain contact formed around the CNTs in a source/drain region. The source/drain contact is in direct contact with only a part of each of the CNT and a dielectric layer partially covers each of the CNT and is disposed between the source/drain contact and each of the CNTs, and no CNT contacts another CNT in a vertical direction. In one or more of the foregoing and following embodiments, the gate structure includes a gate dielectric layer wrapping around each of the CNTs, a work function adjustment layer formed on the gate dielectric layer and a body gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, the work function adjustment layer includes TiN. In one or more of the foregoing and following embodiments, the semiconductor device further includes inner spacers formed between the gate structure and the source/drain contact.

In accordance with another aspect of the present disclosure, a semiconductor device having a gate-all-around field effect transistor (GAA FET) includes a first GAA FET and a second GAA FET. Each of the first GAA FET and the second GAA FET includes carbon nanotubes (CNTs) disposed over a substrate, a gate structure formed around the CNTs in a channel region, and a source/drain contact formed around the CNTs in a source/drain region. The source/drain contact is in direct contact with only a part of the CNTs and a dielectric layer partially covers the CNTs and is disposed between the source/drain contact and the CNTs.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate-all-around field effect transistor (GAA FET), the method comprising:
    forming a fin structure including a plurality of stacked structures each comprising a dielectric layer, a carbon nanotube (CNT) over the dielectric layer, and a support layer over the CNT;
    forming a sacrificial gate structure over the fin structure;
    forming an isolation insulating layer;
    forming a source/drain opening by patterning the isolation insulating layer, wherein a part of the fin structure comprising the CNT over the dielectric layer is exposed in the source/drain opening;
    removing the support layer from each of the plurality of stacked structures in the source/drain opening such that a part of the CNT with the dielectric layer is suspended in the source/drain opening and the CNT is partially exposed in the opening; and
    forming a source/drain contact to fill the source/drain opening,
    wherein the source/drain contact is formed such that, within the source/drain opening filled by the source/drain contact, the source/drain contact is in direct contact with only a part of the CNT, and a part of the dielectric layer is disposed between the source/drain contact and the CNT.

2. The method of claim 1, wherein the part of the dielectric layer includes fixed positive charges inside, inducing negative charges in the CNT.

3. The method of claim 1, wherein the dielectric layer is made of non-stoichiometric silicon nitride.

4. The method of claim 1, wherein:
    the dielectric layer includes a first dielectric layer in contact with the CNT and a second dielectric layer formed on the first dielectric layer, and
    in the part of the dielectric layer, the first dielectric layer and the second dielectric layer constitute an interfacial dielectric dipole structure inducing negative charges in the CNT.

5. The method of claim 4, wherein the first dielectric layer is made of aluminum oxide and the second dielectric layer is made of hafnium oxide.

6. The method of claim 1, wherein:
    the dielectric layer includes a first dielectric layer in contact with the CNT, a second dielectric layer disposed over the first dielectric layer and a third dielectric layer disposed over the second dielectric layer, and
    in the part of the dielectric layer, the first to third dielectric layers constitute an interfacial dielectric dipole structure inducing positive charges in the CNT.

7. The method of claim 6, wherein the first dielectric layer is made of aluminum oxide, and the second dielectric layer is made of silicon oxide and the third dielectric layer is made of aluminum oxide.

8. The method of claim 1, wherein in a cross section, the part of the dielectric layer covers 25% to 90% of an outer circumference of the CNT.

9. The method of claim 1, further comprising, after the source/drain contact is formed:
    forming a gate space by removing the sacrificial gate structure;
    removing the dielectric layer and the support layer in the gate space such that the CNT is exposed in the gate space;
    forming a gate dielectric layer around the CNT and a gate electrode over the gate dielectric layer.

10. The method of claim 9, further comprising, after the support layer is removed and before the source/drain contact is formed, forming an insulating inner spacer at an end of the support layer under the sacrificial gate structure.

11. The method of claim 10, wherein during the dielectric layer and the support layer are removed in the gate space, a part of the dielectric layer disposed between the insulating inner spacer and the CNT is also removed.

12. The method of claim 11, wherein when the dielectric layer and the support layer are removed in the gate space, a part of the dielectric layer disposed between the source/drain contact and the CNT is removed.

13. The method of claim 11, wherein the support layer is made of a dielectric material different from the dielectric layer.

14. The method of claim 1, wherein a plurality of CNTs are included in each of the plurality of stacked structures.

15. The method of claim 1, wherein the support layer is made of a polycrystalline or amorphous material of one of Si, Ge and SiGe.

16. A method of forming a gate-all-around field effect transistor (GAA FET), the method comprising:
    forming a fin structure, in which carbon nanotubes (CNTs) are embedded in a support material, over a substrate;
    forming a sacrificial gate structure over the fin structure;
    forming an insulating layer over the sacrificial gate structure and the fin structure;
    removing the sacrificial gate structure so that a part of the fin structure is exposed;
    removing the support material from the exposed part of the fin structure so that channel regions of CNTs are exposed;
    forming a gate structure around the exposed channel regions of CNTs;
    forming a source/drain opening in the insulating layer;
    removing the support material in the source/drain opening so that source/drain regions of the CNTs are exposed and suspended in the source/drain opening;
    forming a dielectric layer to wrap around the exposed and suspended CNTs in the source/drain opening;

partially removing the dielectric layer so that a part of the dielectric layer remains on the suspended CNTs in the source/drain opening; and forming a source/drain contact to fill the source/drain opening, wherein the source/drain contact is formed such that, within the source/drain opening filled by the source/drain contact, the source/drain contact is in direct contact with part of the CNTs and the remaining part of the dielectric layer is disposed between the source/drain contact and the CNTs.

17. The method of claim 16, wherein the part of the dielectric layer is a single dielectric layer having fixed positive charge inside.

18. The method of claim 16, wherein:
the dielectric layer includes a first dielectric layer in contact with the CNT and a second dielectric layer formed on the first dielectric layer, and
in the remaining part of the dielectric layer, the first dielectric layer and the second dielectric layer constitute a dielectric dipole structure.

19. The method of claim 16, wherein in a cross section, the remaining part of the dielectric layer covers 25% to 90% of an outer circumference of each of the CNTs.

20. A method of forming a gate-all-around field effect transistor (GAA FET), the method comprising:

forming a plurality of fin structures, in each of which carbon nanotubes (CNTs) are embedded in a support material, over a substrate;

forming an isolation insulating layer;

forming a gate structure by using a gate replacement technology around channel regions of the CNTs; and forming a source/drain contact to fill and to contact with source/drain regions of the CNTs, wherein the source/drain contact is formed such that, within the source/drain opening filled by the source/drain contact, the source/drain contact is in direct contact with only a part of each of the CNTs and a dielectric layer partially covers each of the CNTs and is disposed between the source/drain contact and each of the CNTs, the plurality of fin structures are formed by:
repeating disposition of the CNTs and formation of a support layer to form a stacked structure; and
patterning the stacked structure into the plurality of fin structures, and the support layer is made of one of a dielectric material, or a polycrystalline or amorphous material of one of Si, Ge and SiGe.

* * * * *